United States Patent
Malozemoff et al.

(10) Patent No.: US 6,284,979 B1
(45) Date of Patent: *Sep. 4, 2001

(54) LOW RESISTANCE CABLED CONDUCTORS COMPRISING SUPERCONDUCTING CERAMICS

(75) Inventors: Alexis P. Malozemoff, Lexington; Gregory L. Snitchler, Shrewsbury; William L. Barnes, Brockton; Alexander Otto, Chelmsford; Gilbert N. Riley, Jr., Marlborough; Jeffrey M. Seuntjens, Spencer, all of MA (US)

(73) Assignee: American Superconductor Corporation, Westborough, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/851,719

(22) Filed: May 5, 1997

Related U.S. Application Data

(63) Continuation-in-part of application No. 08/834,357, filed on Apr. 16, 1997, now abandoned, which is a continuation of application No. 08/554,737, filed on Nov. 7, 1996, now abandoned.

(51) Int. Cl.$^7$ .................................................. H01B 12/10
(52) U.S. Cl. ................... 174/125.1; 174/129 S; 505/231; 505/431
(58) Field of Search ............................. 174/125.1, 129 S; 505/230, 231, 234, 233, 430, 431, 884, 886, 887, 705, 879

(56) References Cited

U.S. PATENT DOCUMENTS 1,144,252   6/1915   Roebel .......................... 174/129 S
3,764,725   10/1973  Kafta ............................. 174/155

(List continued on next page.)

OTHER PUBLICATIONS

J. Sapriel et al. "Ramam Characterization of A $B_{12}SV_2CaCu_2O_8$ Superconductor crystal and related compounds" European Materials Research Society, pp. 31–38, 1989.*

(List continued on next page.)

Primary Examiner—Albert W. Paladini
(74) Attorney, Agent, or Firm—Fish & Richardson P.C.

(57) ABSTRACT

A cabled conductor is provided for use in a cryogenically cooled circuit including refrigeration having a predetermined operating temperature and efficiency. The conductor includes multiple conductor strands cabled about the longitudinal axis of the conductor at a preselected cabling period, each strand including a composite of superconducting ceramic in intimate contact with conductive matrix material. Each filament has high performance regions in which the filament material is well-textured with its preferred direction aligned perpendicular to the widest longitudinal cross-section of the conductor alternating with poorly superconducting regions which are at least about half the diameter of a filament in length and in which the superconducting ceramic filament is strained by transposition in excess of its critical strain limit. In the poorly superconducting regions, the conductive matrix material provides an alternate current path. The ratio of the average length of the poorly superconducting regions to the preselected cabling period is less than about $(\rho_{300}^e/\rho_o^e)\epsilon E$, where $\rho_o^e$ is the resistivity of the composite at the operating temperature; $\rho_{300}^e$ is the resistivity of the composite at 300 Kelvins; and $\epsilon$ is the predetermined efficiency of the refrigeration means at its operating temperature. In the preferred embodiment, this ratio is less than 1:4, and preferably less than 1:20.

29 Claims, 11 Drawing Sheets

U.S. PATENT DOCUMENTS

| | | | |
|---|---|---|---|
| 4,329,539 | | 5/1982 | Tanaka et al. .................... 174/125.1 |
| 4,826,808 | | 5/1989 | Yurek et al. . |
| 4,857,675 | | 8/1989 | Marancik et al. .................. 174/15.4 |
| 5,038,127 | | 8/1991 | Desch .................................. 505/232 |
| 5,132,278 | | 7/1992 | Stevens et al. ...................... 505/231 |
| 5,189,009 | | 2/1993 | Yurek et al. . |
| 5,318,948 | * | 6/1994 | Okada et al. ........................ 505/230 |
| 5,366,953 | * | 11/1994 | Char et al. ....................... 505/234 X |
| 5,387,891 | * | 2/1995 | Nick ................................. 505/705 X |
| 5,399,547 | | 3/1995 | Negm et al. ......................... 505/430 |

OTHER PUBLICATIONS

Kase et al., "Preparation of the Textured Bi–Based Oxide Tapes by Partial Melting Process," *IEEE Transactions on Magnetics*, 27:1254–1257, Mar. 1991.

Wilson, *Superconducting Magnets*, pp. 197, 307–309, Oxford University Press (1983).

Sandhage et al., "Critical Issues in the OPIT Processing of High–$J_c$BSCCO Superconductors, " *Journal of Metals*, 43:21–25, 1991.

Rosner et al., "Status of HTS Superconductors: Progress in improving Transport Critical Current Densities in HTS Bi–2223 Tapes and Coils," *Cryogenics*, 32:940–948, 1992.

Goodrich et al., "High $T_c$ Superconductors and Critical Current Measurement," *Cryogenics*, 30:667–677, Aug. 1990.

Ekin, "Offset Criterion for Determining Superconductor Critical Current," *Appl. Phys. Lett.*, 55:905–907, Aug. 28, 1989.

Chakrapani et al., "The Effects of Second Phase Additions (SiC, $BaZrO_3$, $BaSnO_3$) on the Microstucture and Superconducting Properties of Zone Melt Texture $YBa_2Cu_3O_{7-x}$," *Applied Superconductivity*, 1:71–80, 1993.

Masur et al., "Bi–axial Texture in $Ca_{0.1}Y_{0.9}Ba_2Cu_4O_8$ Composite Wires Made by Metallic Precursors," *Physica*, C230:274–282, 1994.

Fukutomi et al., "Laser Deposition of $YBA_2Cu_3O_y$ Thin Films on a Metallic Substrate with Biaxially Textured YSZ Buffer Layers Prepared by Modified Bias Sputtering," *Physica*, C219:333–339, 1994.

Motowidlo et al., "Mechanical and Electrical Properties of BSCCO Multifilament Tape Conductors, " Materials Research Society Meeting, San Francisco, CA, Apr. 12–15, 1993.

Tenbrink et al., "Development of Technical High–$T_c$ Superconductor Wires and Tapes," *Applied Spectroscopy*, Paper MF–1, presented at ASC'92, Chicago, USA Aug. 23–28, 1992.

Schewenterly et al., "Critical Current Measurement on Ag/Bi–Pb–Sr–Ca–Cu–O Composite Coils as a Function of Temperature and External Magnetic Field," *IEEE Trans. on Applied Superconductivity*, 3:949–952, Mar. 1993.

Tzong–Jer Yang et al, "Investigation of the Bending Effect and the Critical Current Density on a Bi–Based Superconducting Tape", pp. 803–806, 5th Intnl. Symposium on Superconductivity, Nov. 16–19, 1992, Kobe.

* cited by examiner

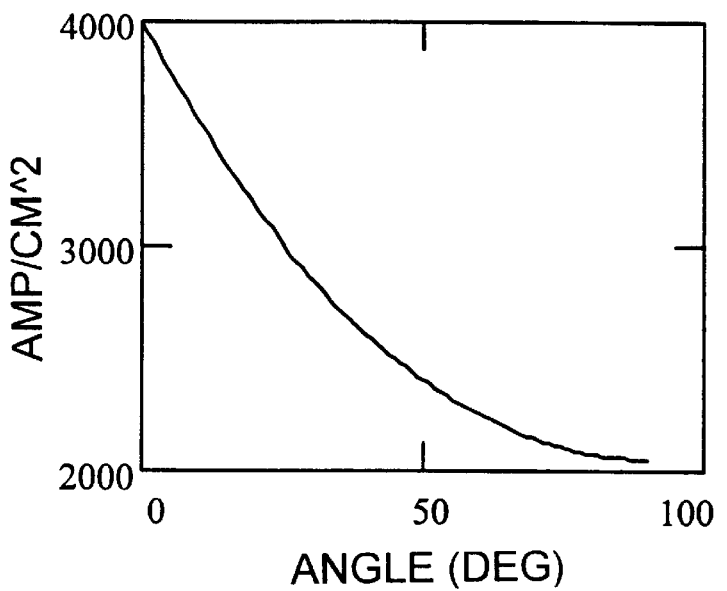
Background Art  FIG. 4
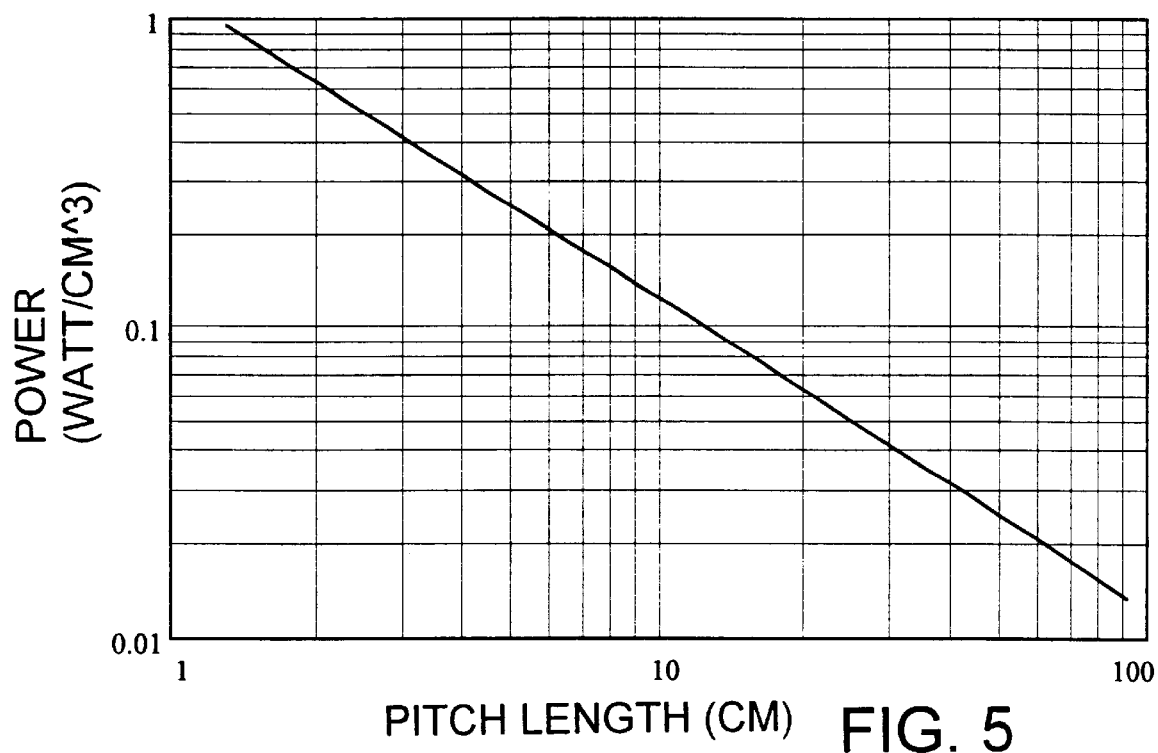
FIG. 5

Power vs. current in an oriented field for the textured domain.

Electric field vs. current in an oriented field for the textured domain.

LOW RESISTANCE CABLED CONDUCTORS COMPRISING SUPERCONDUCTING CERAMICS

Cross-Reference to Related Applications

This is a continuation-in-part of Malozemoff et al, U.S. Pat. appln. Ser. No. 08/834,357 filed Apr. 16, 1997, now abandoned entitled "LOW RESISTANCE CABLED CONDUCTORS COMPRISING SUPERCONDUCTING CERAMICS" which is a continuation of Malozemoff et al, U.S. Pat. appln. Ser. No. 08/554,737 filed Nov. 7, 1995, now abandoned entitled LOW RESISTANCE CABLED CONDUCTORS COMPRISING SUPERCONDUCTING CERAMICS".

BACKGROUND OF THE INVENTION

This invention relates to cabled conductors comprising superconducting ceramics and to a method for using them. Superconductors have gained increasing attention for having the potential to improve the efficiency of electric power and magnetics applications. When held below the critical temperature, current and magnetic field which defines its superconducting state, every superconductor is able to carry DC currents with very little energy loss. Equally important for most conductor applications is the ability of superconductors to carry very high currents, with current densities of thousands of times that of conventional copper conductors. Certain of the ceramic superconductors have the potential to maintain these properties at cryogenic temperatures in the general range of the boiling point of nitrogen. However, several different types of resistive losses can occur in ceramic superconductors. Unlike low transition temperature superconductors, which transition abruptly between the high performance superconducting and low performance normal, i.e., resistive, states if one of their critical values is exceeded, the ceramic superconductors do not. Consequently, for ceramic superconductors, a measurement procedure, known as the offset criterion or the electric field (E) criterion, described, for example, in *High $T_c$ superconductors and critical current measurement,* Cryogenics, Vol 30, pp 667–677 (August 1990), and *Offset criterion for determining super-conductor critical current,* Appl. Phys. Lett. 55(9) (28 August 1989), both of which are herein incorporated in their entirety by reference, is often used to establish the the critical current value, i.e. the current value at which the transition between superconducting and non-superconducting states is considered to occur in ceramic superconductors. This procedure defines the critical current density ($J_c$) as the current density (J) where the tangent to the electric field (E) vs J curve (for a specified temperature and magnetic field level) at a given electric field level, such as 1 $\mu$V/cm, extrapolates to zero electric field. For brevity, the procedure is typically referenced by the value of its electric field criterion. In the transition regime, resistive losses gradually increase to their non-superconducting values. Above the critical current value, the transition regime is known as the flux flow state.

In time varying magnetic fields or currents, all conductors, including ceramic superconductors in their superconducting and flux flow states, have losses which may include hysteresis and various types of coupling losses. These vary with frequency, AC and DC current amplitude and conductor geometry. Periodic multifilamentary, multistranded structures with short repeat lengths have been shown to minimize AC losses for low transition temperature superconductors, as described, for example, in "*Superconducting Magnets*" by Martin Wilson (1983,1990), pp 197, 307–309, which is herein incorporated by reference, and in conventional copper conductors. Both low transition temperature superconductors and conventional copper conductors are commonly fabricated into well-known cabled forms, such as Litz cables, Rutherford cables (a type of Litz cable), Roebel cables, or braids for use in time-varying magnetic fields or currents. U.S. Pat. No. 3,764,725 issue Oct. 9, 1973 to Kafka, U.S. Pat. No. 4,857,675 issued Aug. 15, 1989 to Marancik et al, U.S. Pat. No. 1,144,252 issued Jun. 22, 1915, all of which are herein incorporated in their entirety by reference, teach the use of braided Litz, Rutherford, and Roebel cabled forms, respectively. Typically, for low transition temperature superconductors, techniques such as twisting and bending are used to transpose both the filaments in a conductor strand (to minimize filament coupling losses) and the strands in a multistrand conductor (to minimize strand coupling losses) about their central longitudinal axes.

It has been proposed that similar periodic geometries would minimize certain types of AC losses in ceramic superconductors so they would be desirable for any electrical or magnetic application involving time-varying currents or magnetic fields. For example, U.S. Pat. No. 5,038,127 issued Aug. 6, 1991 to Dersch, describes two periodic arrangements of coated conductors intended to reduce eddy current losses.

However, ceramic superconductors have physical limitations, namely anisotropy and low critical strain values, which typically create very high resistive losses in long lengths of high winding density, tightly cabled conductor. Critical strain is rarely an issue for conventional metal cables. Anisotropy is not a design constraint for cables made of either conventional metal or low transition temperature superconductors.

The superconducting ceramics which have shown greatest promise for electrical and magnetic applications at relatively high temperatures are anisotropic superconducting compounds which require texturing in order to optimize their current-carrying capacity. The current-carrying capacity of any composite containing one of these materials depends significantly on the degree of crystallographic alignment, or "texturing", and intergrain bonding of the superconductor grains induced during the composite manufacturing operation. Suitable texturing methods, all of which are well known in the art, include, for example, various heat treatments to obtain reaction-induced texturing, various deformations to obtain deformation-induced texturing, growth on a textured substrate material, and magnetic alignment. For example, known techniques for texturing the two-layer and three-layer phases of the bismuth-strontium-calcium-copper-oxide family of superconductors are described in Tenbrink, Wilhelm, Heine and Krauth, *Development of Technical High-Tc Superconductor Wires and Tapes, Paper MF-1, Applied Superconductivity Conference, Chicago* Aug. 23–28,1992), and Motowidlo, Galinski, Hoehn, Jr. and Haldar, *Mechanical and Electrical Properties of BSCCO Multifilament Tape Conductors, paper presented at Materials research Society Meeting,* Apr. 12–15, 1993, Kase et al, *IEEE Trans. Mag.* 27(2), 1254(1991), and U.S. Ser. No. 08/041,822 filed Sep. 8, 1994, entitled "Torsional Texturing of Oxide Superconducting Articles", all of which are herein incorporated in their entirety by reference. Some techniques for forming and texturing the yttrium family of oxide superconductors are described, for example, in L. J. Masur et al, *Physica C* 230 (1994) 274–282, M. Fukutomi et al, *Physica C* 219 (1998) 333–339, and V. Chakrapani, D. Balkin, P. McGinn, *Applied Superconductivity, Vol.* 1, *No.*

1/2,(1993), pp. 71–80, all of which are herein incorporated in their entirety by reference. Suitable final heat treatment processes for BSCCO 2223, which are believed to contribute to intergrain bonding via partial melting and crack healing are described, for example, in copending applications U.S. Ser. No. 08/041,822 filed Apr. 1, 1993 and entitled "Improved Processing for Oxide Superconductors", U.S. Ser. No. 08/198,912, filed Feb. 17, 1994 and also entitled "Improved Processing for Oxide Superconductors", and in U.S. Ser. No. 08/553,184, filed Nov. 7, 1995 and entitled "Processing of Oxide Superconducting Cables", all of which are herein incorporated in their entirety by reference.

The desirable crystallographic structure of well-textured ceramic superconductors causes them to have extremely anisotropic current carrying capability, with the highest current flowing in the directions lying in the crystallographic plane containing the a and b direction vectors of the aligned grains, or in other words, orthogonal to the c direction of each grain. Critical current and critical magnetic field may be as much as an order of magnitude lower in a "bad" direction of a well-aligned oxide superconductor than in a "good" direction lying in the crystallographic plane containing the a and b direction vectors of the grains. It is conventional to refer to the set of directions in a crystallographic plane by the vector which is orthogonal to all of them. The c direction is commonly referred to as the preferred direction of the superconductor, because it uniquely defines the set of directions lying in the "good" plane of the material. Any design which relies to a significant degree on current transport in the "bad" direction of the material, such as the designs disclosed in Dersch, cited above, or the "core-wrap" designs discussed below, will be constrained to operate well-below the critical current carrying capacity of the "good" direction, or will have significant resistive losses.

Moreover, ceramic superconductors are typically fragile, brittle, granular compounds, which cannot by themselves be easily processed into traditional conductor forms. Stranded conductors such as wires and tapes are generally made by forming composites containing one or more filaments of the ceramic superconductor in intimate contact with a matrix material, typically a noble metal such as silver or a silver alloy, to form more ductile conductors. Known methods for forming composite wires and tapes include the powder-in-tube (PIT) method, using oxide or metallic precursors, a physical film forming method such as sputtering or ion beam assisted deposition (IBAD), a chemical film forming method such as chemical vapor deposition (CVD), or the like. For example, multifilamentary wires and tapes made by the PIT process may be used. The general PIT process is described, for example, in U.S. Pat. Nos. 4,826,808, and 5,189,009 to Yurek et al. and L. J. Masur et al, *Physica C* 230 (1994) 274–282, which teach the use of a metal alloy precursor having the same metal content as the desired superconducting oxide, and in C. H. Rosner, M. S. Walker, P. Haldar, and L. R. Motowidlo, "*Status of HTS superconductors: Progress in improving transport critical current densities in HTS Bi-2223 tapes and coils*" (presented at conference '*Critical Currents in High Tc Superconductors*', Vienna, Austria, April, 1992) and K. Sandhage, G. N. Riley Jr.,. and W. L. Carter, "*Critical Issues in the OPIT Processing of High Jc BSCCO Superconductors*", *Journal of Metals*, 43,(1991) 21–25, which teach the use of either a mixture of powders of the oxide components of the superconductor or of a powder having the nominal composition of the superconductor, all of which are herein incorporated in their entirety by reference. An ion-beam-assisted deposition process is described in M. Fukutomi et al, *Physica C* 219 (1994) 333–339, which is herein incorporated in its entirety by reference. But these composite strands are still brittle by the standards of conventional conductors, and cannot be twisted or otherwise bent to a tight radial arc without a reduction of available current density due to microcracking which disrupts the current paths through the filaments. FIG. 3 shows the normalized critical current, $I_c/I_{co}$ (the critical current at the applied strain divided by the critical current at zero strain) as a function of applied strain. For most ceramic superconducting composites, the critical current, $I_c$, is independent of the amount of tensile strain placed on the composite until the strain reaches a threshold value, commonly referred to as the critical strain of the material. Above that threshold, the critical current value decreases asymptotically with increasing tensile strain, as shown in FIG. 3, due to formation of localized microcracks in the material. In typical superconducting oxide filaments, for example, available current density begins to drop at bends which create only a fraction of a percent of strain, depending on the filament cross-section and material. To make high packing factor cables from these materials would require bend strains far in excess of the tolerances of typical superconducting ceramic filaments. Although methods for repairing microcracking are known, if the local tensile strain is much greater than the critical strain value, as it is likely to be due to the bending and compression forces exerted during the cabling operations, micro-crack formation can occur to such an extent that significant healing during a later thermomechanical processing step becomes impossible. When this happens, portions of the filament revert to partially superconducting or totally resistive states, with high power losses per unit area.

Thus, in designing superconducting ceramic conductors suitable for use in time-varying magnetic fields or currents, the loss reductions achieved by periodic transposition must be balanced against the increased resistive losses from straining the superconductor or from orienting it in its bad direction in order to acheive transposition. Various "core-wrap" designs for high temperature superconducting cable have been proposed in which the conductor strands are helically wound in a gentle arc around a large central cooling pipe or other supporting structure in order to minimize the strand bending radii. However the packing factor of these designs is unacceptably low for most commercial purposes such as magnets or coils. Together with total power consumption, which includes both AC losses and resistive losses, packing factor determines the suitability of a cabled conductor for a given application. For example, a 0.010" thick strand wrapped to a bend strain of 1% around a hollow central core would require a wrap radius of 0.5", so the total packing factor of the finished cable and core would be on the order of 2–3%, not the 75% or more desired for commercial applications. In addition, if the filaments are textured while flat in accordance with conventional practices, it is not possible to transpose them through a uniform 360 degree arc without orienting roughly half of their current carrying capacity in the "bad" direction relative to the applied magnetic field. If the current flow through this "bad" portion exceeds its critical value, there will be significant resistive losses. Because the radius of this class of cabled conductor designs must be so large to offset its mechanical and electrical limitations, and so much of the cable is oriented in directions where its current carrying capacity is substantially reduced, these designs have found limited commercial acceptance despite the potential advantages of superconducting ceramic cables. Designs in which the superconducting ceramic is strained well past its critical limit have not been proposed.

A practical design for a low loss, high winding density cabled conductor specifically adapted to the strengths and limitations of superconducting ceramic composites has yet to be provided.

Thus, an object of this invention is to provide a cabled conductor design using superconducting ceramic composites which can provide the combined advantages of low overall power consumption and a superior packing factor at a given current density, operating temperature and magnetic field than existing designs.

Another object of this invention is to provide improved cabled conductor designs with low resistive losses and high current carrying capacity in comparison to helically wound superconducting ceramic or conventional copper and silver cabled conductors.

SUMMARY OF THE INVENTION

Surprisingly, it has been found that it is possible to manufacture high-performing cabled conductors for use in cryogenically cooled circuits in which the filaments of superconducting ceramic are strained by transposition well in excess of their critical strain limits.

The invention is an eccentric, multi-strand cabled conductor. The conductor includes a plurality of conductor strands cabled about the longitudinal axis of the conductor at a preselected cabling period, preferably in the range of 1 to 50 times the width of the conductor. The major axis of the vertical cross-section of the conductor is at least five times larger than the minor axis of the vertical cross-section of the conductor. Each of the strands is a composite of one or more superconducting ceramic filaments with a conductive matrix material. Each superconducting filament includes high performance regions periodically alternating with poorly superconducting regions. The poorly superconducting regions, in which the filaments of superconducting ceramics are strained by transposition in excess of their critical strain limits, are at least about half the diameter of a filament in length. At least the poorly superconducting regions are in intimate contact with the conductive matrix material which provides an alternate current path. In a prefered embodiment, there are poorly superconducting regions in the general vicinity of any vertex of the cabled conductor. In a preferred embodiment, there are about two high performance regions and two poorly superconducting regions per cabling period.

The cabled conductor is designed for use in a cryogenically cooled circuit which also includes refrigeration with a predetermined operating temperature, $T_o$, and efficiency, $\epsilon$, at this operating temperature, and the high performance regions of the cabled conductor are superconducting at this operating temperature. By "cabled conductor" is meant a structure in which a plurality of elongated conductor strands are assembled together in close proximity along their length in a periodic arrangement about the longitudinal axis of the conductor ("cabled"), most typically by full or partial transposition. By "cabling period" is meant the shortest length parallel to the longitudinal axis of the cabled conductor over which the periodic arrangement repeats. The strands may be loose or bonded together, with or without an additional separating material between the strands. The strands may be insulated or in electrical contact with each other, but for AC applications, are preferably insulated. In the poorly superconducting regions, the filament material is poorly superconducting in the direction perpendicular to the widest longitudinal cross-section of the conductor. It is preferred that each strand comprise a plurality of substantially continuous filaments.

The ratio of the average length of the poorly superconducting regions to the preselected cabling period is less than about $(\rho_{300}^e/\rho_o^e)\epsilon$, where $\rho_o^e$ is the resistivity of the composite at the operating temperature; $\rho_{300}^e$ is the resistivity of the composite at 300 Kelvins; and $\epsilon$ is the predetermined efficiency of the refrigeration means at its operating temperature, $T_o$. In the preferred embodiment, this ratio is less than 1:4, and more preferably less than 1:20.

By "superconducting ceramic material" is meant an atomic composition comprising oxides, sulfides, selenides, tellurides, nitrides, boron-carbides or oxycarbonates, which, when appropriately processed or with the proper microstructure, has a superconducting transition above 30 K, but which, with another processing or microstructure but the same overall composition, may be poorly superconducting. Superconducting oxides are preferred. Superconducting oxides of the rare earth-barium-copper-oxide and bismuth-strontium-calcium-copper-oxide families are especially preferred.

By "well-textured" is meant a combined degree of local crystallographic alignment and intergrain bonding of the superconductor grains in the filament sufficient to create a high performance region in the desired texturing direction at the rated current, temperature and magnetic field for the conductor.

By "high performance region" is meant a region of the filament where the current-voltage characteristic is such that the local electric field is less than 1 $\mu$V/cm at the rated current, temperature and magnetic field for the conductor. In the high performance regions, the filament material is well-textured with its preferred direction aligned perpendicular to the widest longitudinal cross-section of the conductor.

By "poorly superconducting region" is meant a region of the filament where the current-voltage characteristic is such that the local electric field is greater than 1 $\mu$V/cm at the rated current, temperature and magnetic field for the conductor. Typically, the poorly superconducting regions contain the sharp bends in the filaments which allow the fabrication of a high packing factor cable with flattened high performance regions. In preferred embodiments, the average filament diameter will be in the range of about 0.01 cm to about 0.0001 cm, and the length of the poorly superconducting regions will be at lest half the filament diameter. Typically, poorly superconducting regions dissipate at least twice as much power as well-textured areas at the rated current, temperature, and magnetic field. Poorly superconducting regions may carry current in either a partially superconducting state or in a purely resistive state. Because the conductive matrix is in intimate contact with the poorly superconducting regions of the filament, it provides an alternate current path in these regions and current will be shared.

In a preferred embodiment, the preselected cabling period is in the range of 1 to 100 centimeters and more preferably 5 to 50 cm. In a most preferred embodiment, the average length of the poorly superconducting regions is less than about one fiftieth of the preselected cabling period. In the most preferred embodiment, the preselected cabling period is at least 10 cm and the average length of the poorly superconducting regions is less than about 0.2 cm, but greater than about 0.0001 cm.

In particular aspects of the invention, cabled conductors made in accordance with the invention may have packing factors of at least 75% and preferably at least 85%. By "packing factor" is meant one minus the fraction of void space in the cable material.

In another aspect of the invention, a cabled conductor as described above may be operated in a stable hybrid state having low total power losses by cooling the conductor to a predetermined temperature in a predetermined magnetic field below its rated temperature and field, and supplying a current to the conductor in a direction substantially parallel to the longitudinal axis of the conductor which is no greater than the rated current of the conductor but greater than the critical current of at least one of the poorly superconducting regions.

In another aspect of the invention, a cabled conductor as described above may be operated in a stable hybrid state having low total power losses by cooling the conductor to a predetermined temperature below its rated temperature, and, applying a predetermined magnetic field to the conductor having a primary component orthogonal to the preferred direction of the conductor which is less than the rated magnetic field of the conductor but greater than the critical magnetic field of at least one of the poorly superconducting regions.

These and other objects, features, aspects and advantages of the present invention will become more apparent from the following detailed description of the present invention when taken in conjunction with the accompanying drawings, in which like numbers refer to like or corresponding parts.

BRIEF DESCRIPTION OF THE DRAWINGS

FIG. 4 (prior art) is a graph showing the critical current density of a core-wrapped superconducting cable made in accordance with the prior art as described in Example 1, as a function of the angle between its preferred direction and an external magnetic field.

FIG. 5 is a graph comparing the power losses of the prior art cable of FIG. 4 with the power losses of a cabled conductor made in accordance with an embodiment of the invention as described in Example 1, as a function of cabling period.

DETAILED DESCRIPTION OF THE PREFERRED EMBODIMENTS

A cabled conductor is provided for use in a cryogenically cooled circuit including a refrigeration means having a predetermined operating temperature and efficiency. The refrigeration means may be, for example, a cryorefrigerator or a cryogenic liquid. The conductor is rated for a predetermined current, temperature and magnetic field. The rating defines the outer limits of the operating conditions for which the cabled conductor was designed. The rated current, temperature and magnetic field are no greater than the operating temperatures of the refrigeration means with which the conductor may be used and within the critical ranges of current, temperature and magnetic field for the superconducting ceramic. It will be recalled that a standard measurement procedure defines a critical current density ($J_c$) as the current density (J) where the tangent to the electric field (E) vs J curve (for a specified temperature and magnetic field level) at a given electric field level, such as 1 $\mu$V/cm, extrapolates to zero electric field. For superconducting ceramics, these critical ranges are typically interdependent, so the rating need not be a single value for the temperature, current and magnetic field, but may specify a set of possible values for each which conform to a predetermined relationship.

Eccentric cabled conductors made in accordance with the invention exhibit high packing factors, good DC performance and superior AC performance. In cases where the direction of desired current flow can be oriented along the longitudinal axis of the conductor, or the widest cross-section of the conductor can be oriented orthogonal to an applied magnetic field, preferred embodiments of the invention provide lower total power losses than competing designs such as room-temperature copper cables. The conductor performance is characterized by substantially linear current to voltage characteristics with current carrying capacity well in excess of the capacity of the purely resistive portions of the cable.

Figure 1:
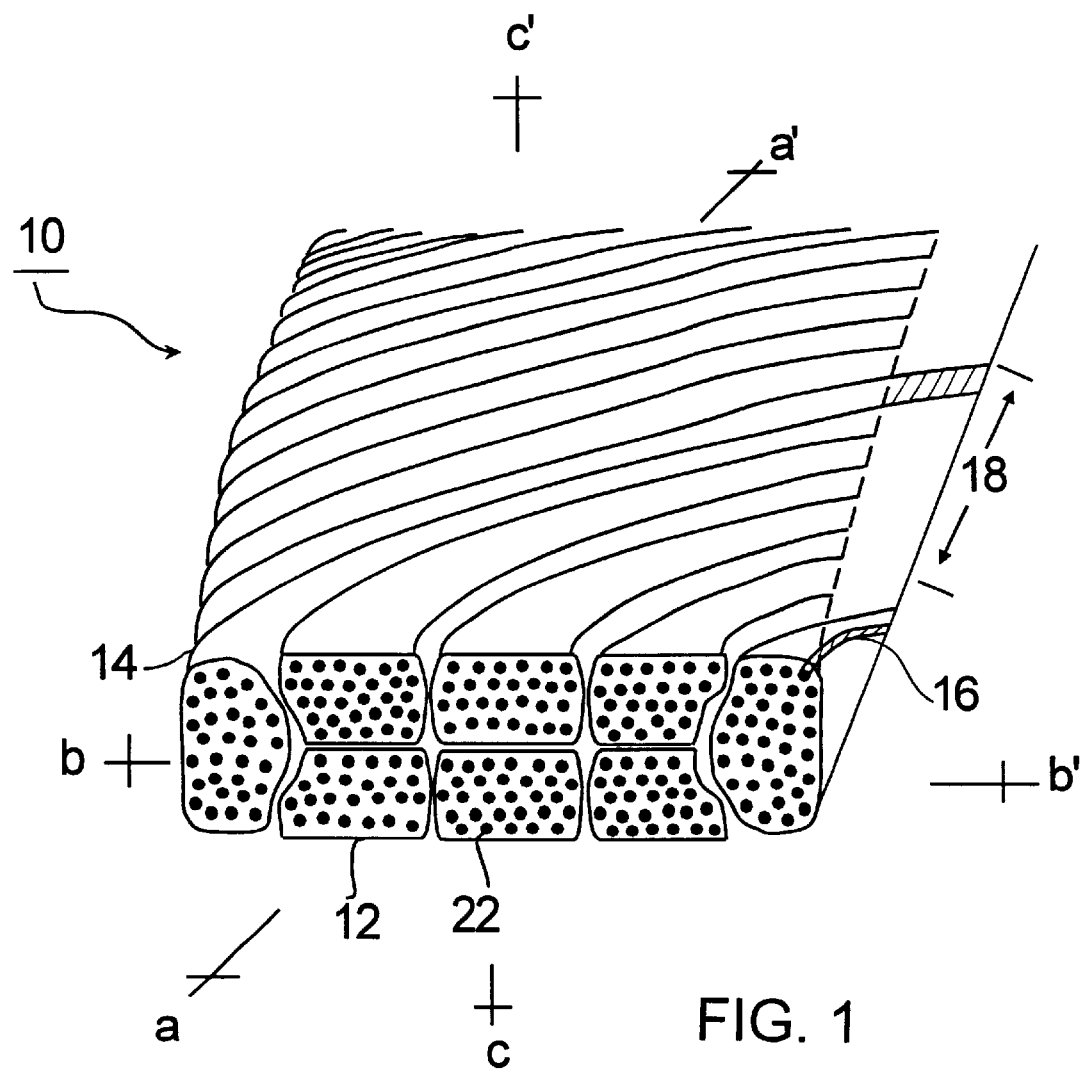
FIG. 1 is a perspective view showing a cabled conductor 10 in accordance with one embodiment of the present invention.

Referring now to the drawings, FIG. 1 is a perspective view of a cabled conductor 10 in accordance with one embodiment of the current invention. The cabled conductor 20 comprises a plurality of strands 12, each comprising a composite of one or more filaments of superconducting ceramic in intimate contact with conductive matrix material. The strands are mechanically cabled about the longitudinal axis of the conductor at a preselected cabling period preferably in the range of 1 to 50 times the width of the conductor. In FIG. 1, line a–a' defines the longitudinal axis of the conductor, line b–b' defines the major axis of its vertical cross-section, and line c–c' defines the minor axis of its vertical cross-section. Lines a–a' and b–b' together define the widest longitudinal cross-section of the conductor. Lines b–b' and c–c' together define a vertical cross-section of the conductor and points 14 and 16 define the vertices of the vertical cross-section. Line c–c' is orthogonal to the preferred current direction for the conductor, which flows in the a-b plane. In accordance with the invention, the vertical cross-section of the conductor will preferably take the form of an elongated ellipse or a similar shape, such as a rectangle, with the major axis being at least five times, and preferably ten to twenty times larger than the minor axis. Such shapes have high packing factors, typically on the order of 75% or more. Because of the limitations of superconducting ceramic material discussed earlier, there will typically be poorly superconducting regions in which the filaments of superconducting ceramic are strained by transposition in excess of their critical strain limits in the general vicinity of any vertex when a cable is manufactured in accordance with these specifications.

By "poorly superconducting region" is meant a region of the filament where the current-voltage characteristic is such that the local electric field is greater than 1 $\mu$V/cm at the rated current, temperature and magnetic field for the conductor, so the poorly superconducting regions do not superconduct under all the possible operating conditions for the cabled conductor. Typically, poorly superconducting regions dissipate at least twice as much power as well-textured areas at the rated current, temperature, and magnetic field. Poorly superconducting regions may be caused by poor intergrain bonding, due for example to unhealed microcracks introduced during the strand-forming or cabling processes or the compaction processes necessary to achieve a high packing factor. The filaments may have discontinuous areas due to necking, cracking, or the growth of inclusions. Alternatively, local alignment of grains in a direction other than the preferred direction, which would, for example, result from texturing flat strands in a uniform direction and then cabling by a rigid process, could create poor texture. The failure of the grains to establish a local alignment pattern might also create poor texture. Poorly superconducting regions may also be deliberately caused by processing certain regions of the filament material under different conditions, since the superconducting ceramics exhibit both superconducting and non-superconducting behavior under different processing conditions. It is a feature of the invention that cabled conductors made in accordance with the invention and incorporating these poorly superconducting regions will possess overall current densities and current-to-voltage characteristics comparable to those of fully superconducting cables, and will have lower power losses in certain applications.

Figure 2:
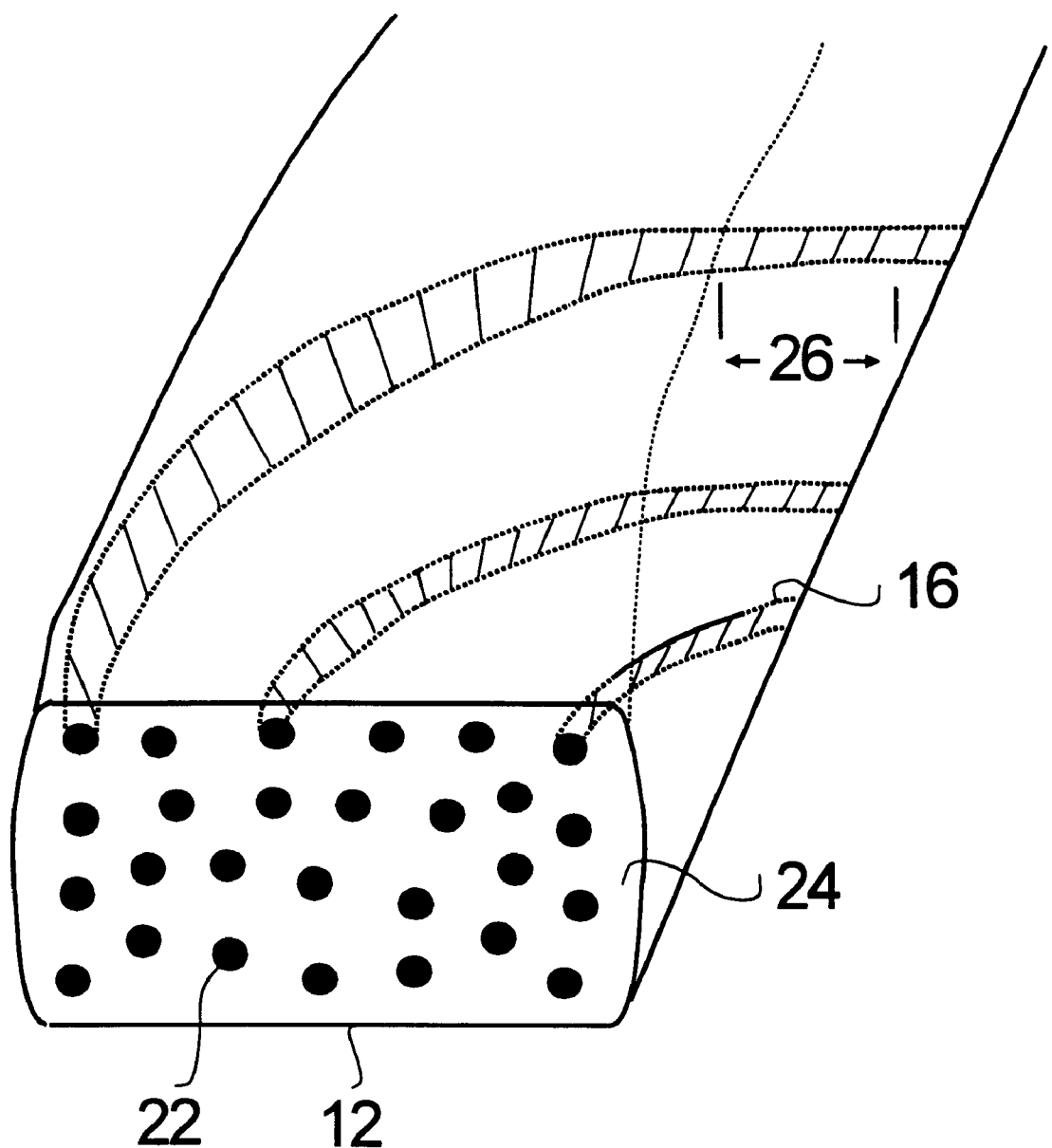
FIG. 2 is an enlarged sectional view of a superconducting conductor strand provided in the cabled conductor shown in FIG. 1.
Figure 3:
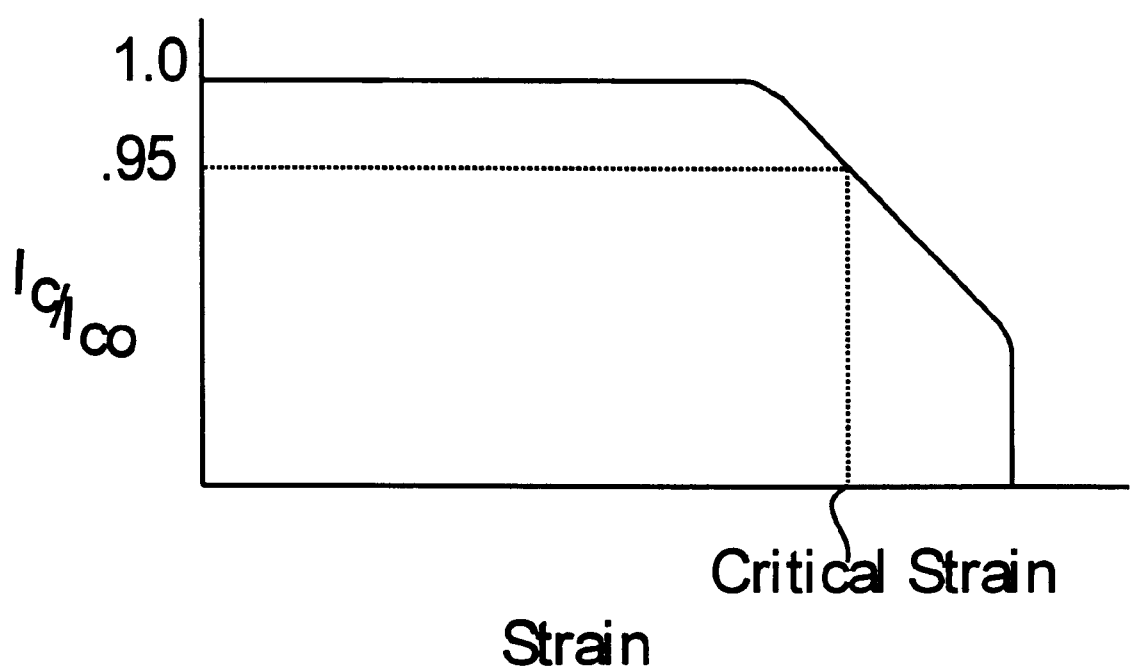
FIG. 3 is a diagram showing the decrease in critical current values with bending strain for a typical superconducting oxide composite.

As may be understood from the enlarged sectional view of conductor strand 12 shown in FIG. 2, each conductor strand comprises one or more filaments 22 of superconducting ceramic material. Each strand further comprises a conductive matrix material 24 in intimate contact with, i.e., surrounding or supporting, at least the poorly conductive regions of the filaments 22. In the preferred embodiment shown in FIG. 2, each strand is a multifilamentary wire or tape in which a plurality of filaments 22 are surrounded by the conductive matrix 24. However, other strand geometries in which the matrix material is in intimate contact with one or more filaments, such as monofilamentary wires or tapes, strands which are themselves assemblages of cabled strands, and coated conductors in which the filament of superconducting ceramic material takes the form of a film coated on a flexible and at least partly conductive substrate, are all within the scope of the invention. For AC applications, it is preferred that the filaments be twisted about themselves. Since both brittleness and hysteretic losses increase with filament diameter, it is preferable that the conductor strand 12 contain many fine, substantially continuous filaments that are dimensionally uniform and discrete along the length of the conductor. Filaments with cross-sectional areas on the order of $10^{-4}$ to $10^{-8}$ cm$^2$ are preferred.

Each filament comprises a plurality of high performance regions in which the filament material is well-textured with its preferred direction oriented perpendicular relative to the widest longitudinal cross-section of the conductor alternating with poorly superconducting regions. Because of the eccentricity of the cable, most of the length of each filament will be in a high performance region. In preferred embodiments, each filament consists essentially of alternating high performance regions and poorly superconducting regions. Poorly superconducting regions may carry current in a partially superconductive state, such as the flux flow or vortex liquid states, or in a purely resistive state. Because the conductive matrix is in intimate contact with the poorly superconducting regions of the filaments, current will be shared with the conductive matrix in either case. While the conductive matrix always provides an alternate current path in poorly superconducting regions, it will normally carry nearly all of the current when the filament region is in a resistive state and some portion when it is in a partially superconducting state.

There are typically about two high performance regions and two poorly superconducting regions per cabling period. By "high performance region" is meant a region of the filament where the current-voltage characteristic is such that the local electric field is less than 1 $\mu$V/cm at the at the rated current, temperature and magnetic field for the conductor, so the high performance regions are superconducting under all rated operating conditions for the cabled conductor. The ratio of the average length of the poorly superconducting regions to the preselected cabling period is less than about $(\rho_{300}^e/\rho_o^e)\epsilon$, where $\rho_o^e$ is the resistivity of the composite at the operating temperature; $\rho_{300}^e$ is the resistivity of the composite at 300 Kelvins; and $\epsilon$ is the predetermined efficiency of the refrigeration means if at its operating temperature, $T_o$, in Kelvins. For example, if the refrigeration means is a mechanical cryocooler, $\epsilon$ can be written as the Carnot efficiency, $T_o/(300-T_o)$ of the cryocooler at its predetermined operating temperature multiplied by another factor, typically on the order of 0.05 to 0.2 for the cryocoolers employed in connection with the invention, which represents losses due, for example, to the choice of a less efficient refrigeration cycle than the ideal Carnot cycle and to heat leaks in the cryocooler. As shown in Example 1, preferred embodiments wherein the ratio of the average length of the poorly superconducting regions to the preselected cabling period is less than 1:4, and more preferably less than 1:20, cables made in accordance with the invention may be made which have lower power losses per unit volume in external magnetic fields than either unstrained core-wrapped superconducting ceramic cables or conventional copper or silver cables operated at room temperature. In a preferred embodiment, the preselected cabling period is in the range of 1 to 100 centimeters and more preferably 5 to 50 cm. In a preferred embodiment, the average length of the poorly superconducting regions is less than about one fiftieth of the preselected cabling period.

The invention may be readily adapted to any superconducting ceramic material and to any strand manufacturing process which produces well-textured filaments of the ceramic selected. By "well-textured" is meant a combined degree of local crystallographic alignment and intergrain bonding of the superconductor grains in the filament sufficient to create a high performance region in the desired texturing direction at the rated current, temperature and magnetic field for the conductor.

Any desired superconducting ceramic may be included in the filaments. Superconducting ceramics of the oxide, sulfide, selenide, telluride, nitride, boron carbide or oxycarbonate types may typically be used, and superconducting oxides are preferred. For example, members of the rare earth (RBCO) families of oxide superconductors, particularly the yttrium family (YBCO) and the neodymium family (NBCO); the bismuth (BSCCO) family of oxide superconductors, the thallium (TBSCCO) family of oxide superconductors; or the mercury (HBSCCO) family of oxide superconductors may be used. The bismuth family and yttrium families of oxide superconductors are most preferred for operation of the invention. Thallination, the addition of doping materials, including but not limited to lead and bismuth, variations from ideal stoichiometric proportions and such other variations in the formulation of the desired superconducting oxides as are well known in the art, are also within the scope and spirit of the invention. The members of the BSCCO family of superconductors most preferred for the operation of the present invention are $Bi_2Sr_2Ca_2Cu_3O_x$ (BSCCO 2223) and $Bi_2Sr_2Ca_1Cu_2O_x$ (BSCCO 2212), particularly in their lead-doped forms. The members of the YBCO family of superconductors most preferred for the operation of the present invention are $Y_1Ba_2Cu_3O_x$ (YBCO 123), $Y_1Ba_2Cu_4O_x$ (YBCO 124) or $Y_2Ba_4Cu_7O_x$ (YBCO 247).

"Conductive matrix" is used herein to mean a conductive material or homogeneous mixture of materials which supports or binds a substance, specifically including the poorly superconducting regions of the filaments, disposed within or around the conductive matrix. It is preferred that the conductive matrix have a resistivity of less than 10 $\mu$ohm cm at operating conditions. Metals which are "noble", which is used herein to mean that they are substantially non-reactive with respect to oxide superconductors and their precursors and to oxygen under the expected conditions (temperature, pressure, atmosphere) of manufacture and use, and alloys substantially comprising noble metals, including oxide dispersion strengthened (ODS) silver, are the preferred matrix materials. "Alloy" is used herein to mean an intimate mixture of substantially metallic phases or a solid solution of two or more elements. Preferred noble metals include silver (Ag), gold (Au), platinum (Pt) and palladium (Pd). Silver and its alloys, being lowest in cost of these materials, are most preferred for large-scale manufacturing. In many embodiments, the entire filament will be in intimate contact with the conductive matrix material. In some embodiments, the filaments may be surrounded or supported by a multi-component matrix, including a conductive matrix in intimate contact with the poorly superconducting regions of the filaments and one or more additional matrix materials with greater insulating properties surrounding or supporting the highly superconducting regions of the filaments.

The strands 12 may be prepared for cabling by any conventional method, such as a powder-in-tube (PIT) method, using oxide or metallic precursors, a physical film forming method such as sputtering or ion beam assisted deposition (IBAD), a chemical film forming method such as chemical vapor deposition (CVD), or the like.

The strands may be cabled in partially or fully processed form. In particular, if the strands are fabricated by the PIT process, they may be cabled before, during, or after the completion of texturing. Texturing may be accomplished by an of the known methods, but it is most preferred that a combination of deformations and heat treatments be used. For members of the bismuth family of superconducting oxides especially, it is preferred that the cable be subjected to one or more heat treatments after cabling designed to minimize losses of critical current due, for example, to formation of localized microcracks during the cable manufacturing process. A melt-textured growth technique such as that described in Kase et al, supra, may be used for BSCCO 2212 and a partial melting process such as one of those described in copending applications U.S. Ser. No. 08/041,822 filed Apr. 1, 1993 and entitled "Improved Processing for Oxide Superconductors", U.S. Ser. No. 08/198,912, filed Feb. 17, 1994 and also entitled "Improved Processing for Oxide Superconductors", and in U.S. Ser. No. 08/553,184, filed Nov. 7, 1995 and entitled "*Processing of Oxide Superconducting Cables*",supra. These applications call for a one or more two-step treatments after deformation, cabling, or both of the oxide superconductor cable, in which (a) a liquid phase is formed such that the liquid phase co-exists with the desired oxide superconductor; and (b) the liquid phase is then transformed into the desired oxide superconductor without any intermediate deformation. The methods of the invention can be used to heal or patially heal defects in any oxide superconductor or superconducting composite cable which result from DIT processing and/or cabling operations. These two step heat treatments operate in the following manner to heal defects. The liquid phase is formed upon partial melting of the oxide superconductor cable. During partial melting of the cable, non-superconducting materials and intermediate oxide phases may be present with the desired oxide superconductor phase. During the partial melting step of the invention the desired oxide superconductor, the non-superconducting materials, oxide superconducting precursors, the desired oxide superconductor or a mixture of these components may melt to form the liquid phase.

The type of cabling styles which are contemplated for use in this process include, but are in no way limited to, Roebel cabling, Rutherford cabling, braiding and other forms of Litz cabling. Rigid or planetary forms of any of these may be used. Litz cable has complete transposition of strands. Roebel, Rutherford and braids are special types of Litz cables. Some cable types, such as a six around one configuration do not have complete transposition, but may also be satisfactory.

Particular advantages of this invention include its scalablity to large scale manufacturing techniques and high packing factor cable designs. Strands formed as described below may be cabled at high packing factors on conventional cabling equipment such as that supplied by the Entwhistle Company of Hudson, Mass. Planetary or rigid cabling equipment may be used. If substantial deformation texturing will be performed on the filament material after cabling to orient the preferred direction of current flow parallel to the widest longitudinal cross-section of the cable, as described in in Example 3 below, a rigid cabling technique is preferred for strands with an aspect ratio greater than about 2:1, and either rigid or planetary cabling techniques may be used for lower aspect ratio strands. Deformation texturing after cabling, as illustrated in Example 3, is described in copending U.S. Ser. No. 08/544,814 entitled "Cabled Conductors Containing Anisotropic Superconducting Compounds & Method for Making Them" and filed Nov. 7, 1995, which application is herein incorporated in its entirety by reference. The application discloses a method for making a cabled conductor by forming a plurality of suitable composite strands, forming a cabled intermediate from the strands by transposing them about the longitudinal axis of the conductor at a preselected strand lay pitch, and, texturing the strands in one or more steps including at least one step involving application of a deformation texturing process with a primary component directed orthogonal to the widest longitudinal cross-section of the cabled intermediate, at least one such orthogonal texturing step occurring subsequent to said strand transposition step.

If the strands will be substantially fully textured prior to cabling, a "ferris wheel" type of planetary cabling, in which the strand is not twisted around its longitudinal axis during transposition, is preferred to use the anisotropic current carrying structure of the superconducting ceramics as fully as possible. One method for successfully cabling highly aspected tape before the final set of heat treatments, further described in Example 4 below, involves the weaving of the tapes together at the required pitch to form a 2-high cable, which may be any number of tapes in width, and terminating each tape when it reaches the edge of the cable. A suitable insulator (e.g., oxide) can be applied to the overlapping regions in the midregions of the cable, while allowing metal to metal tape contact at the overlapping regions near the cable edges. In the final heat treatments, a modest mechanical pressure is applied to the woven cable, thereby sintering the overlapping flat surfaces of each tape segment. The final product then has mainly superconducting pathways in each tape segment, with the occasional need for current to transfer from one overlapping tape to the next as it approaches the edge of the cable. A second approach for making the identical structure, described in Example 2 below, consists of the helical winding of the tapes onto a cylindrical form at the desired pitch, followed by a flattening deformation step to make the 2-high by arbitrarily wide cable with terminated filaments in each tape at the cable edges. Both lay-up methods provide the cable with the required in-field orientation anisotropy in Jc that was present in the tape because the same surface of each wire is always parallel to the same surface of the cable.

If the strands are cabled by a method which forms continuous radial arcs rather than sharp bends, one or more longitudinal deformations may preferably be performed on the cabled strands after cabling in order to compress the poorly superconducting regions created by the cabling operation and to flatten the high performance regions so as to align as much of each strand as possible in the preferred direction of current flow. It is preferred that sufficient deformation be performed to improve the packing factor, where the packing factor is defined as one minus the fraction of void space in the cable material, where the fraction of void space is the ratio of the volume of void space in the cable to the total volume of the cable. In particular aspects of the invention, cabled conductors made in accordance with the invention may have packing factors of at least 75% and preferably at least 85%.

Cabled conductors made in accordance with the invention will exhibit substantially linear current/voltage characteristics when incremental current is supplied to the system at or below their rated temperatures, currents and magnetic fields, but will carry currents well in excess of those transportable by their conductive matrix materials alone.

The advantage of using an eccentric cable configuration including poorly superconducting regions is not obvious to one skilled in the art. In particular, the poorly superconducting regions will create resistive losses and if these losses are significantly higher than those obtainable from a core-wrapped superconducting cable, the advantage of greatly improved packing factor may not appear to justify the use of the invention, unless space is a primary constraint. However, for many applications, such as magnets, space is the most significant consideration. Moreover, the inventive design can provide substantially lower power consumption than the core-wrapped model in cases where the direction of desired current flow can be oriented parallel to the widest longitudinal cross-section of the conductor, and in cases in which an externally generated field is applied with a substantial component orthogonal to the widest longitudinal cross-section of the conductor. In addition, if the resistive losses divided by the refrigeration efficiency are substantially lower than the resistive losses of conventional conductors operating at room temperature, the added expense of refrigeration will be amply justified. At operating temperatures in the vicinity of 77 Kelvins, the efficiencies of refrigerators commercially available today are on the order 0.05–0.10, so to provide a substantial advantage, losses on the order of thirty times lower than those of conventional conductors are desired.

Thus, in one aspect of the invention, the cabled conductor may be used for electrical applications in a cryogenically cooled circuit including a refrigeration means having a predetermined operating temperature and efficiency in a stable hybrid state with low total power losses and high packing factors by cooling the conductor to the operating temperature of the refrigeration means and supplying a current along the longitudinal axis of the conductor which is less than the rated current of the conductor but greater than the critical current of at least one of the poorly superconducting regions.

In another aspect of the invention, the cabled conductor may be used for electrical applications in a cryogenically cooled circuit including a refrigeration means having a predetermined operating temperature and efficiency in a stable hybrid state with low total power losses and high packing factors by cooling the conductor to the operating temperature of the refrigeration means, and applying a predetermined magnetic field to the conductor having a primary component orthogonal to the preferred direction of the conductor which is less than the rated magnetic field of the conductor but greater than the critical magnetic field of at least one of the poorly superconducting regions.

The invention may be further understood from the following examples:

EXAMPLE 1

A cable made in accordance with the invention is compared first, to a superconducting ceramic composite cable wrapped in a Litz configuration around a core at a sufficiently low strain to have no significant damage points and second, to a conventional cabled silver conductor operating at room temperature to assess total power losses.

For the purposes of the example, in both the superconducting cables, the superconducting ceramic is assumed to be BSCCO 2223 and the matrix material is assumed to be pure silver (with a resistivity, $\rho^{ag}=0.2\times10^{-6}$ ohm cm at 77 Kelvins), with nominally 28% ceramic superconductor present in the cross-section of the composite (so the fill factor, $\lambda=0.28$). In addition, the externally generated applied magnetic field, B, is assumed to be 0.1 tesla, and the peak engineering critical current density, $J_c$, in the preferred (a-b plane) direction at 70 Kelvin and B=0 is assumed to be 4000 Amp/cm².

When engineering current density, J, is measured as a function of the angle, $\theta$, between the preferred direction of a sample tape and the applied magnetic field for several different values of $\theta$, $J(0°, 0.1)=4977$ A/cm² and $J(90°, 0.1)=2350$ A/cm², using a 0.1 inch times 0.01 inch 85-filament BSCCO 2223 and silver composite sample. $\theta=0°$ when the applied field is oriented parallel to the widest face of the conductor. The actual $J(0°, 0)=4630$ A/cm² for the sample at 77 K. FIG. 4 contains a plot of the critical current as a function of θ based on the data from the sample normalized to J(0°, 0.1)=4000 A/cm² at 70 K. A best-fit approximation to this curve may be represented by:

$$J(\theta, B) = (4000 \text{ Amp/cm}^2) \exp(-B\sin\theta/B_o)$$

where $B_o = 0.15$ Tesla is a best-fit value.

The BSCCO 2223 composite cable can be treated as a parallel circuit with an effective resistance $1//\rho^e = \lambda/\rho^{sc} + (1-\lambda)/\rho^{ag}$, where $\rho^e$ is the effective resistivity of the composite tape, $\rho^{sc}$ is the resistivity of the ceramic superconductor, in this case BSCCO 2223, and $\rho^{ag}$ is the resistivity of the matrix material, in this case pure silver. Moreover, for operational current density values, $J_o$, which are near $J_c$, the electric field of a ceramic superconductor is approximately $v = v_o [J_o/J(\theta, B)]^n$. Stating the resistance of the circuit explicitly in terms of voltage characteristics, for $J_o = J_c$:

$$\rho^e(\theta) = 1/[(1-\lambda)/\rho^{ag}] + \lambda v_o J_o[n-1]/J(\theta, B)^n$$

where n is the electric field index value (E J$^n$)

Considering first the case of the unstrained, helically wound cable, the strands in the core-wrapped cable spiral in (ab-plane) and out (c-axis) of the preferred direction in a sinusoidal manner. The power losses for the specified operational parameters will be:

$$\frac{2}{\pi} \cdot \int_0^{\frac{\pi}{2}} \rho^e(\theta) \cdot [J_o]^2 d\theta = 2.213 \cdot \frac{\text{watt}}{\text{cm}^3}$$

By comparison, for a cabled conductor made in accordance with the invention, the major portion of each filament will constitute high performance regions located in predominantly in a preferred field direction, with virtually no power losses. It is assumed that there will be two poorly superconducting regions per filament in every cabling period, L, and that the length, D, of a typical poorly superconducting region is 0.1 cm. Assuming the worst case, which is that the poorly superconducting regions are purely resistive and only carry current in their silver portions, the power losses per unit volume will be $P = 2 J_o^2 \rho^{ag} D/L$ In FIG. 5, we assume an operating current density, $J_o$, of 4000 amp/cm2 in the poorly superconducting regions and a D=0.1 cm. We can therefore make a direct comparison between a resistive cable made in accordance with the invention and the cylindrically wound cable. A cable made in accordance with the invention with a 10 cm cabling period and a poorly superconducting region length of 0.1 cm has losses an order of magnitude lower than the core-wrapped cable.

Figure 6:
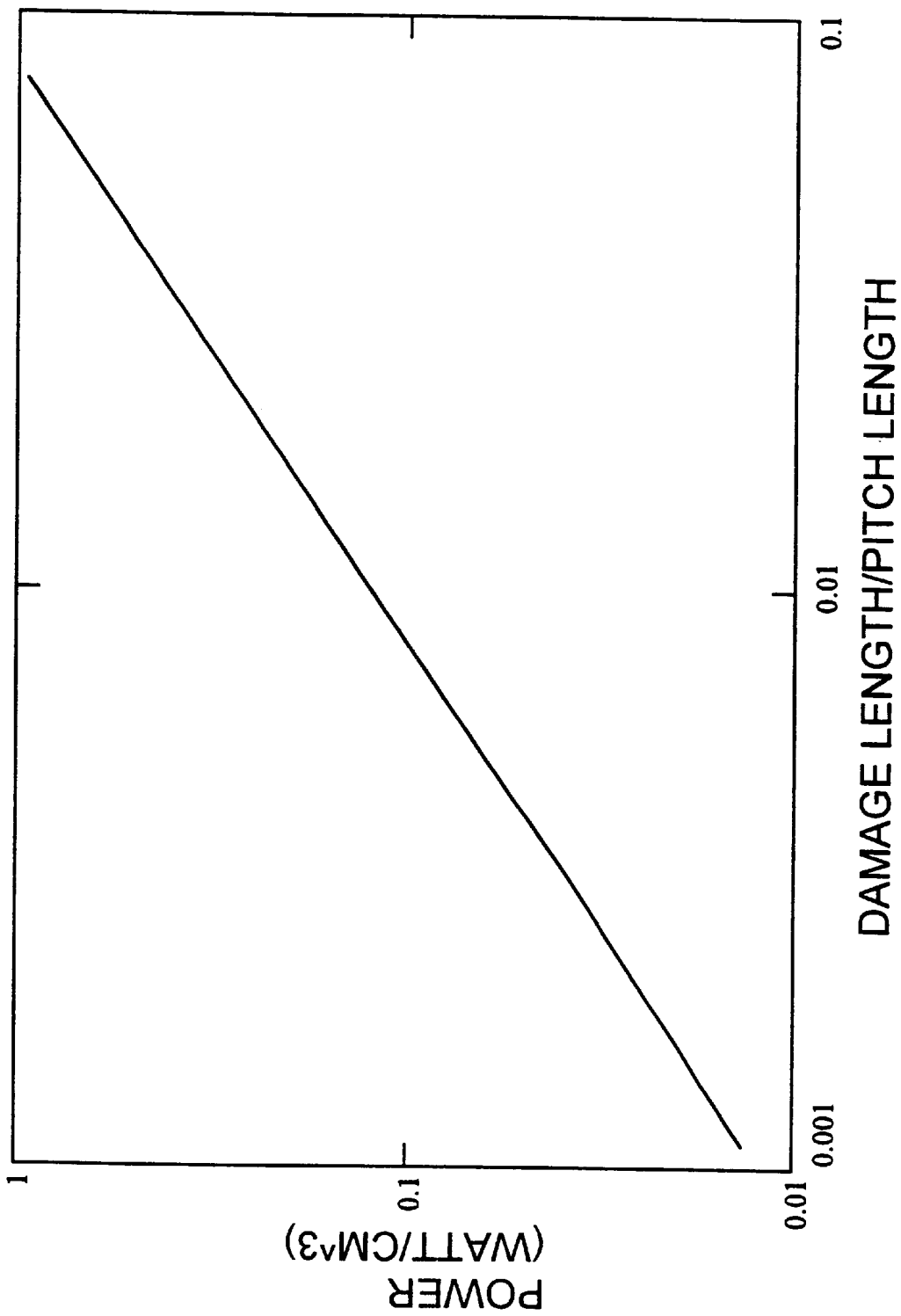
FIG. 6 is a graph showing the power losses of a cabled conductor made in accordance with an embodiment of the invention as described in Example 1, as a function of the ratio of the length of the poorly superconducting region to the cabling period.

It is clear from the final equation that the cabling period and the length of the poorly superconducting period are critical in determining the overall resistive losses in cables made in accordance with the invention. FIG. 6 shows power losses as a function of the ratio between the length of the poorly superconducting region and the cabling period. The power losses of a helically wound cable will exceed those of the inventive cable when this ratio, D/L is somewhere between about 1:4 and 1:8, depending on the composition of the tape used to make the cable and the conditions of operation, e.g. B, Jo, chosen for it. In the preferred embodiment, the preselected cabling period is at least 10 cm and the average length of the poorly superconducting regions is less than about 0.2 cm., for D/L <1/20, and the losses of this embodiment will be far lower than those of a comparable helically wound superconducting ceramic cable.

Since the overall losses of the coils will be proportional to their I²R losses, the superconducting coil will be less efficient operated at room temperature than at its rated temperature if the product of the efficiency, ε, of the refrigeration means and the resistivity, $\rho_o^e$, of the superconducting cabled conductor operated at its rated operating temperature will have to be less than the the resistivity, $\rho_3^e$, of the same coil operated at room temperature, that is $(\rho_o^e/\rho_{300}^e)\epsilon < 1$. But $\rho_o^e = \rho_o^e D/L$, and the resistivity of BSCCO 2223 at room temperature is so much higher than the reisitivity of silver, that essentially all the current will flow through the silver matrix. So, if $D/L < (\rho_{300}^e/\rho_o^a)\epsilon$, the coil will be more energy efficient at its rated temperature. For a pure silver matrix and the efficiency, ε, of a typical refrigerator operating between 77K and 300 K, D/L<¼.

More generally, coils using the inventive superconducting conductor can be shown to be more efficient than a silver or copper coil of similar dimensions operting at room temperature. In comparing the inventive cabled conductor to a conventional copper or silver conductor operated at room temperature, the same space constraints will be imposed on both designs by holding the cross-sectional areas of the two designs the same. A coil operated at room temperature would generate 24 watts/cm³ of power loss. Based on currently available cryorefrigerators, about 30 watts of power must be used to remove 1 watt of power from a typical BSCCO-2223 coil at 70 K, therefore, the break-even point for equal overall power consumption is 0.8 watt/cm³ of power loss generated by the superconducting cable. The preferred embodiments of the invention provide power losses well below this break-even range.

EXAMPLE 2

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20.32 cm) and an outer diameter of 1.25 inch (3.18 cm) to form a billet. The billets were extruded to a diameter of ½ inch (1.27 cm) and annealed at 450 C. for 1 hour. The billet diameter was narrowed with multiple die steps, with a final step drawn through a 0.70 inch (1.78 cm) hexagonally shaped die into a silver/precursor hexagonal wires.

Eighty-five of the wires were bundled together and inserted into a silver sheath having an inner diameter of 0.76 inch ( 0.19 cm) and an outer diameter of 0.84 inch (2.13 cm) to form a bundle, and the assembly was annealed at 450 for 4 hours. The bundle was drawn to 0.072 inch (0.183 cm) via successive 20% and 10% pass reductions to form a multifilamentary round strand and annealed at 600 C. in air for 2 hours to thermally bond the assembly. The round strand is then rolled in three reduction passes to a final dimension of 0.010 inch ( cm)×0.100 inch (cm) with intermediate heat treatments in which the strand is ramped up to 400 C. at 10 C./min, ramped to 815 C. at 1 815 C./min held at 815 C. for 16 hours and cooled to room temperature, all at 7.5% oxygen. After a final anneal at 450 C. for 1 hour, twelve lengths of the strand were cut to about 8 inches for cabling.

Six of the strands were wrapped in parallel to one another in a right hand lay at an angle of about 25 degrees around a silver tube with an inner diameter of 0.225 inch (cm), an outer diameter of 0.250 inch (cm) and a length of 6.0 inch (cm). These were then overwrapped by six strands wrapped in parallel to one another in a left hand lay at an angle of about 25 degrees.

The cabled intermediate was then placed between the platens of a hydraulic press and crushed at 10 Kpsig until no further deformation was observable. It was then subjected to thermomechanical processing by ramping up to 830 C. at 0.1–10 C./minute in a 7.5% oxygen atmosphere and immediately giving a final heat treatment in a 7.5% oxygen atmosphere at 830 C. for 40 hours, 811 C. for 40 hours and 787 C. for 30 hours to form and sinter the desired 2223 material in the filament cores.

Figure 7:
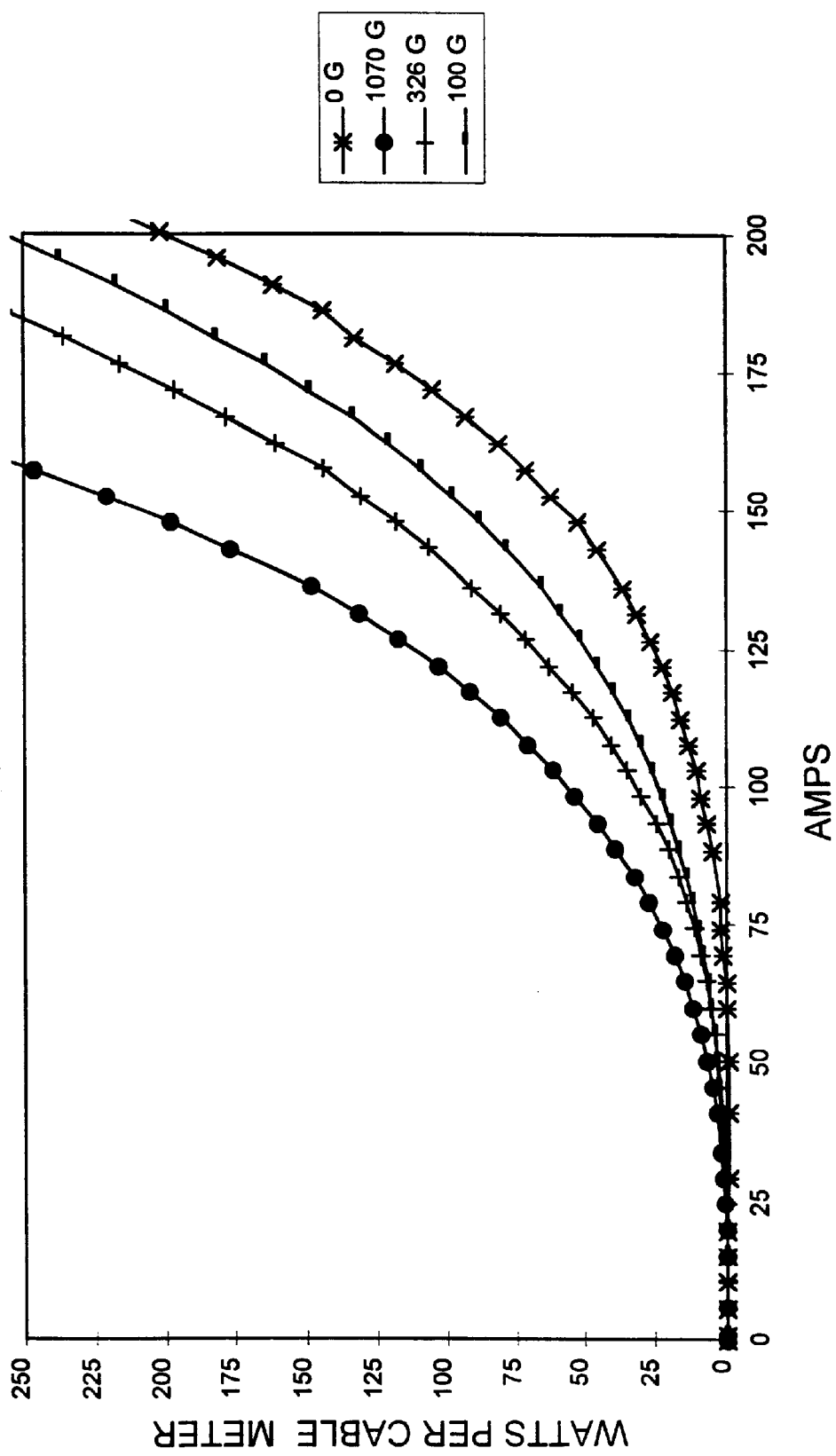
FIG. 7 is a graph showing the power consumption as a function of applied current in four different magnetic fields, for a cabled conductor made in accordance with an embodiment of the invention described in Example 2.

FIG. 7 shows the power consumption of the cabled conductor, in watts/m of cable per amp of applied current in magnetic fields of 0 Gauss, 100 Gauss, 326 Gauss, and 1070 Gauss.

Figure 8:
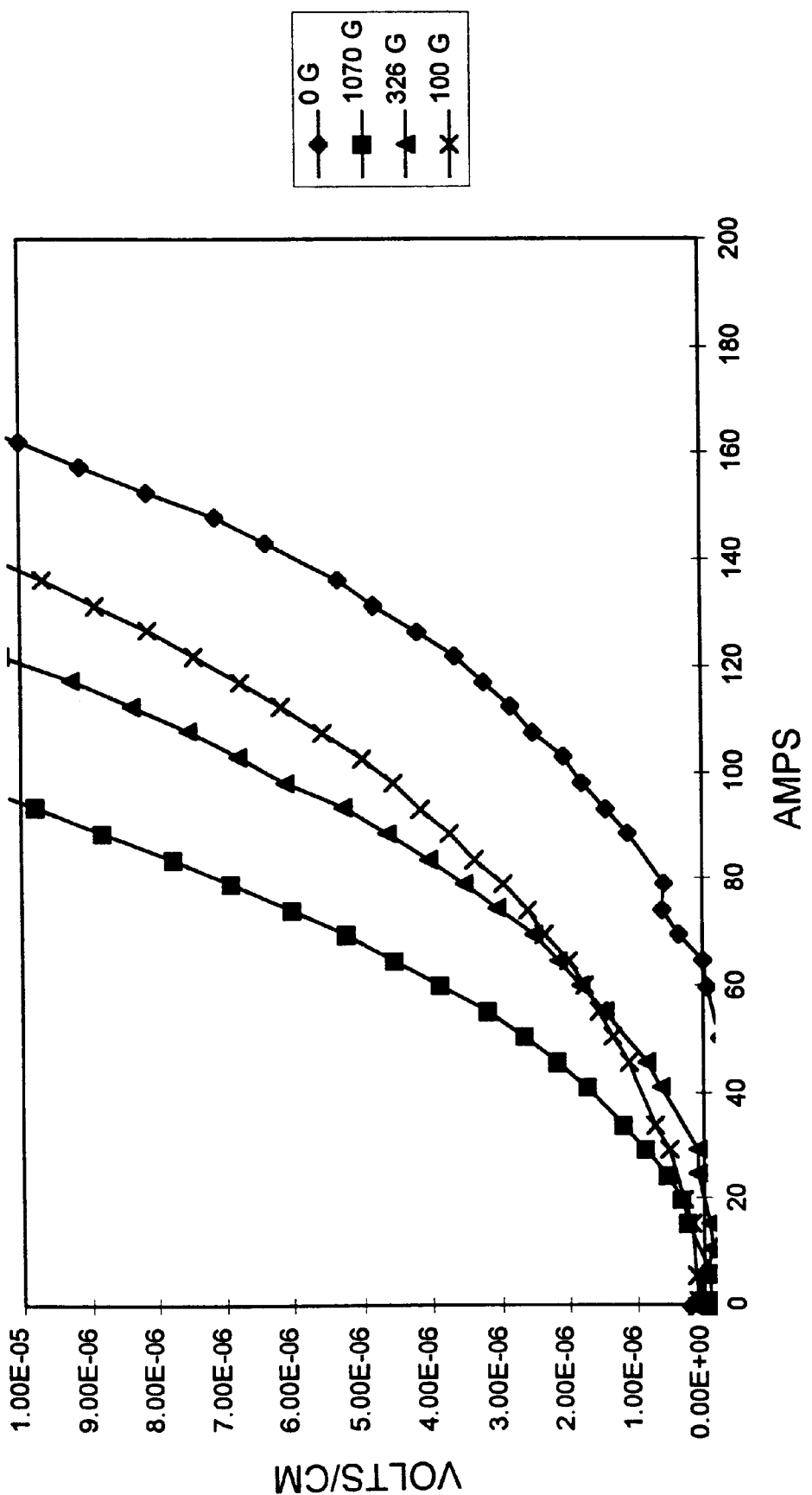
FIG. 8 is a graph showing the voltage to current characteristics for the same cabled conductor and magnetic fields used in FIG. 7.
Figure 9:
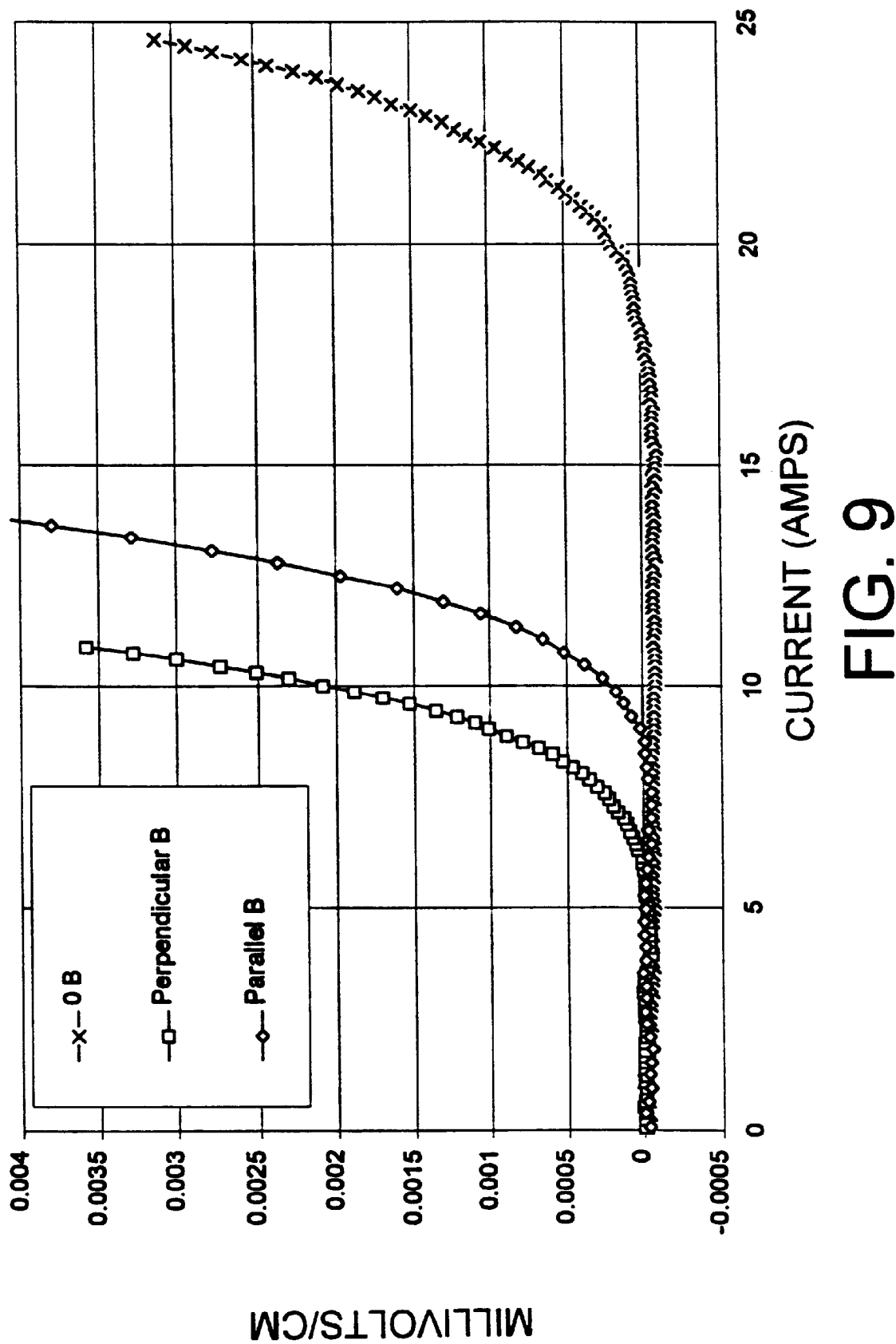
FIG. 9 (prior art) is a graph showing the voltage to current characteristics of a helically wound strand made in accordance with the prior art at three different magneticc field values and orientations.

FIG. 8 shows the electric field to current characteristics of the same cabled conductor in the same applied magnetic fields, and demonstrates that the cable has substantially linear voltage-to-current characteristics.

EXAMPLE 3

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20.32 cm) and an outer diameter of 1.25 inch (3.18 cm) to form a billet. The billets were extruded to a diameter of ½ inch (1.27 cm) and annealed at 450 C. for 1 hour. The billet diameter was narrowed with multiple die steps, with a final step drawn through a 0.70 inch (1.78 cm) hexagonally shaped die into a silver/precursor hexagonal wires.

A 91 filament composite was made with an approximately a hexagonal array filament pattern using standard monofilament 2223 precursor in a fine Ag sheath. The monofilament processing was similar to Example 1 above. The multifilament billet processing was also similar to Example 1 above up to the point where roll deformation begins. In this example, the multifilament composite was further drawn to 0.0245 inch in diameter and the composite was annealed in air at 300 C. for nominally 10 minutes. The material was divided approximately equally into 8 parts and each was layer wound onto a cabling spool.

An 8 strand Rutherford cable was made from the 91 filament composite strand. A rigid cabling configuration was used, where the spools' orientation are fixed relative to the rotating support that holds them. The tension on each strand was controlled by magnetic breaks and set to nominally 0.5 inch-pounds. The width and thickness of the cable were set by a non-powered turks-head to be 0.096 and 0.048 inch, respectively. The cable lay pitch was set by a capstan take-up speed relative to the rotations speed to be nominally 1.03 inch. After cabling, the material was heat treated at 760 C. for 2 hr. in 0.1 atm of oxygen. The cable was then rolled to at thickness of 0.0157 inch. The cable was then heat treated for 6 hr. at 827 C. in 7.5% oxygen in nitrogen atmosphere. The cable was finally turks head rolled to 0.0126 inch in thickness. A final heat treatment of 40 hr. at 827 C., 30 hr. at 808 C., and 30 hr. at 748 C., all in 0.075 atm of oxygen in nitrogen was employed. The average engineering critical current density, Je, at 77K (B=0) was 2996 $A/cm^2$ at a fill factor of nominally 20% superconductor cross section.

EXAMPLE 4

Precursor alloy filaments consisting of Y, Ba and Cu in the nominal atomic ratio of 1:2:3 along with 20 wt % silver in accordance with the metallic precursor process for making PIT wires generally described in L. J. Masur et al, *Physica C* 230 (1994) 274–282, supra. Rectangular cross-sectioned (0.02" by 0.100") multifilamentary (26,011 filaments) precursor alloy/silver composite wires were fabricated, and oxidized at 320 C. for 1000 hours in 100 atm oxygen followed by an oxygen pressure adjustment bake consisting of 40 hours at 400 C. in 99.99% argon gas. They were then roll deformed (alternating forward and reverse) in 9% per pass thickness reduction increments with a four high rolling mill and 0.8" diameter work rolls accompanied by anneals after every additional 50% strain consisting of a five minute bake in air at 180 C. The rolled size of the tapes was 0.0039" by 0.115" in cross-section. They were then baked in argon for 30 hours at 350 C. Each wire was then rolled to a thickness reduction strain of 10%.

The tape pieces were manually woven into a 3-across, 2-high cable that had a 30 degree pitch and was approximately 0.55" wide by 0.007" thick (aspect ratio of 78). The woven cable was then placed between alumina-felt lined ceramic plates that were then wrapped tightly together with high strength wire. The cables were then baked for 0.5 hours at 750 C. in argon gas. The plates were then removed, and the cable surfaces cleaned of the alumina felt. The cables were then subjected to final heat treatments consisting of 11.5 hour bakes at 750 C. in argon gas followed by a 40 hour bake at 450 C. in oxygen at one atmosphere pressure. The filaments in the reacted tapes consisted of the well known YBCO-123 oxide superconductor.

The superconducting transport properties of the cables were measured at 77 K end to end, as well as relative to individual tape segments comprising the cable over one cm voltage tap lengths. The data for one cable is presented in Table 1. The average critical currents measured were about 0.35 A and 0.8 A at the 1 and 10 microvolt/cm electric field criteria. It is important to note that although the cable is formed so as to require passage of electric current through resistive connections between cabled tape segments, even the maximum silver contribution possible to current transport is less than one twentieth of the current carried by the cable. Therefore, most of the current is transported as supercurrent, with very little voltage (and energy loss) arising from transport across the resistive junctions of the tapes in the cable.

TABLE 1

Results of electrical measurements

| Voltage criteria (micro-volts/cm) | cable critical whole length (5 cm measured) | currents (Amps) 4 tape average (1 cm measured) | maximum Ag sheath current at 77 K (at the voltage criteria) |
|---|---|---|---|
| 1.00 | 0.34 | 0.36 | 0.0075 |
| 10.00 | 0.80 | 0.81 | 0.075 |

EXAMPLE 5

A plurality of superconducting YBCO-123 strands in coated conductor form may be made in accordance with the ion-beam-assisted deposition process as described in M. Fukutomi et al, *Physica C* 219 (1998) 333–339, supra. A multicomponent matrix may be formed by coating the narrow faces of a highly aspected rectangular insulating layer with a silver alloy or other conductive matrix material. It is preferred that the conductive coating be etched or sectioned at intervals corresponding to the preselected strand lay pitch. The strands may be wrapped around the multicomponent matrix at the preselected strand lay pitch, with the superconducting faces of the strands facing inward toward the multicomponent matrix. Current will be shared with the conductive coating in the poorly superconducting regions at the corners and along the narrow faces of the cable.

EXAMPLE 6

A comparison was made between operating a significant portion of an entire conductor significantly into its transition domain compared to forming periodic poorly superconducting regions at joints between high performance regions. Both experiments were performed with 0.150"×0.006" 85 filament BSCCO 2223 wires with a 28% fill factor and Ic's in the range of 20–27 Amps at 77 K (B=0), made generally as described in Example 2 above.

The first sample was helically wound around a mandrel. The sample was place in an external field solenoid such that the sample was subjected to a spatially sinusoidal configuration where $B=B_o\cos(\theta)+iB_o\sin(\theta)$ where $\theta$ is the angle between the applied external magnetic field and the preferred direction of the wire. Exhibit 6 demonstrates that the power loss for the helical configuration represents a significant system power loss. For example, if a 12 amp operating current is selected, the power loss is $P/V=E^*J=(5\times10^{-4} \text{ volts/m})(2\times10^7 \text{ amp/m}^2)=5\times10^3 \text{ watt/m}^3$.

Figure 10:
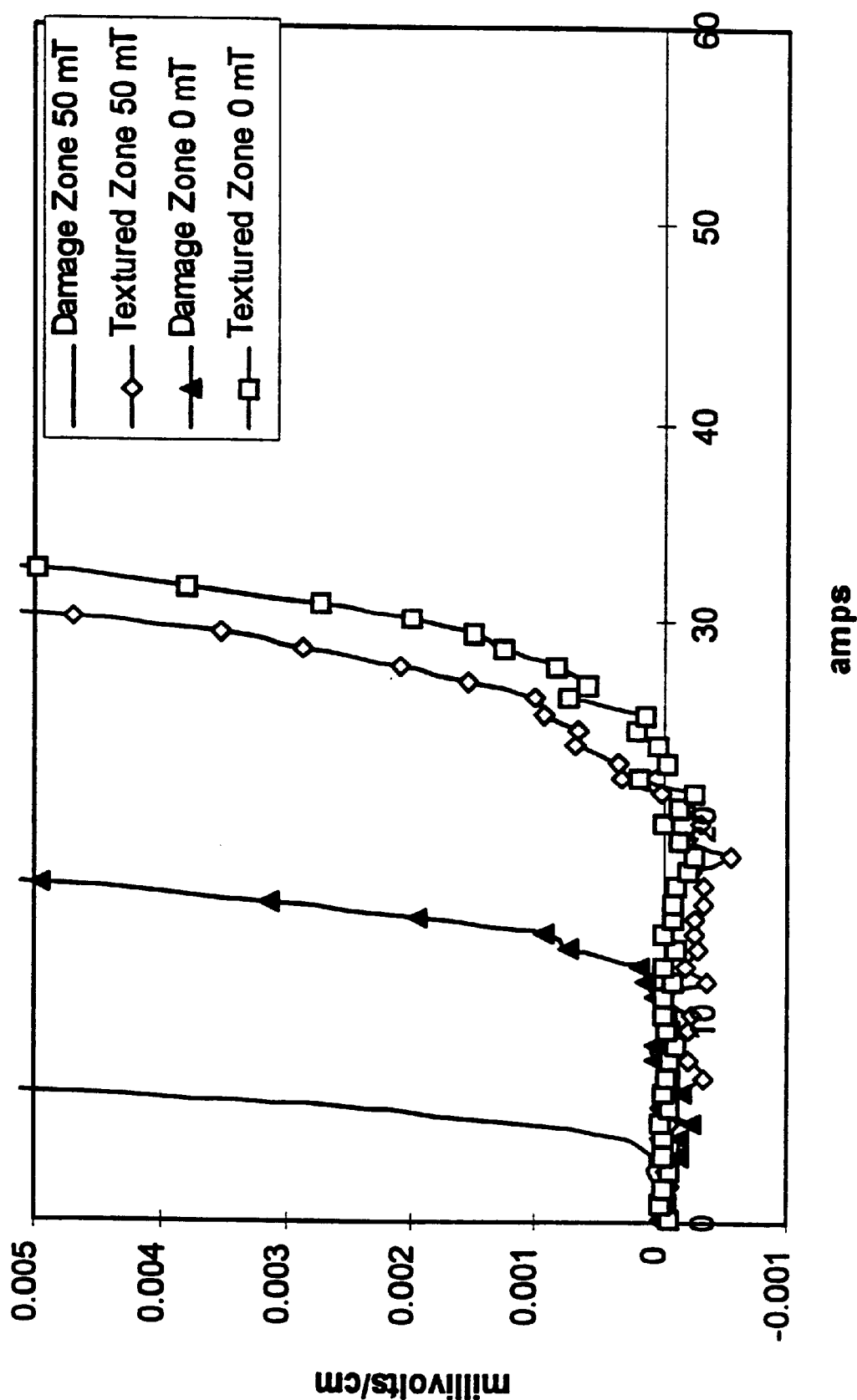
FIG. 10 is a graph showing the voltage to current characteristics at low voltages of a strand bent to form poorly superconducting regions and high performance regions, at two different magnetic field values.
Figure 11:
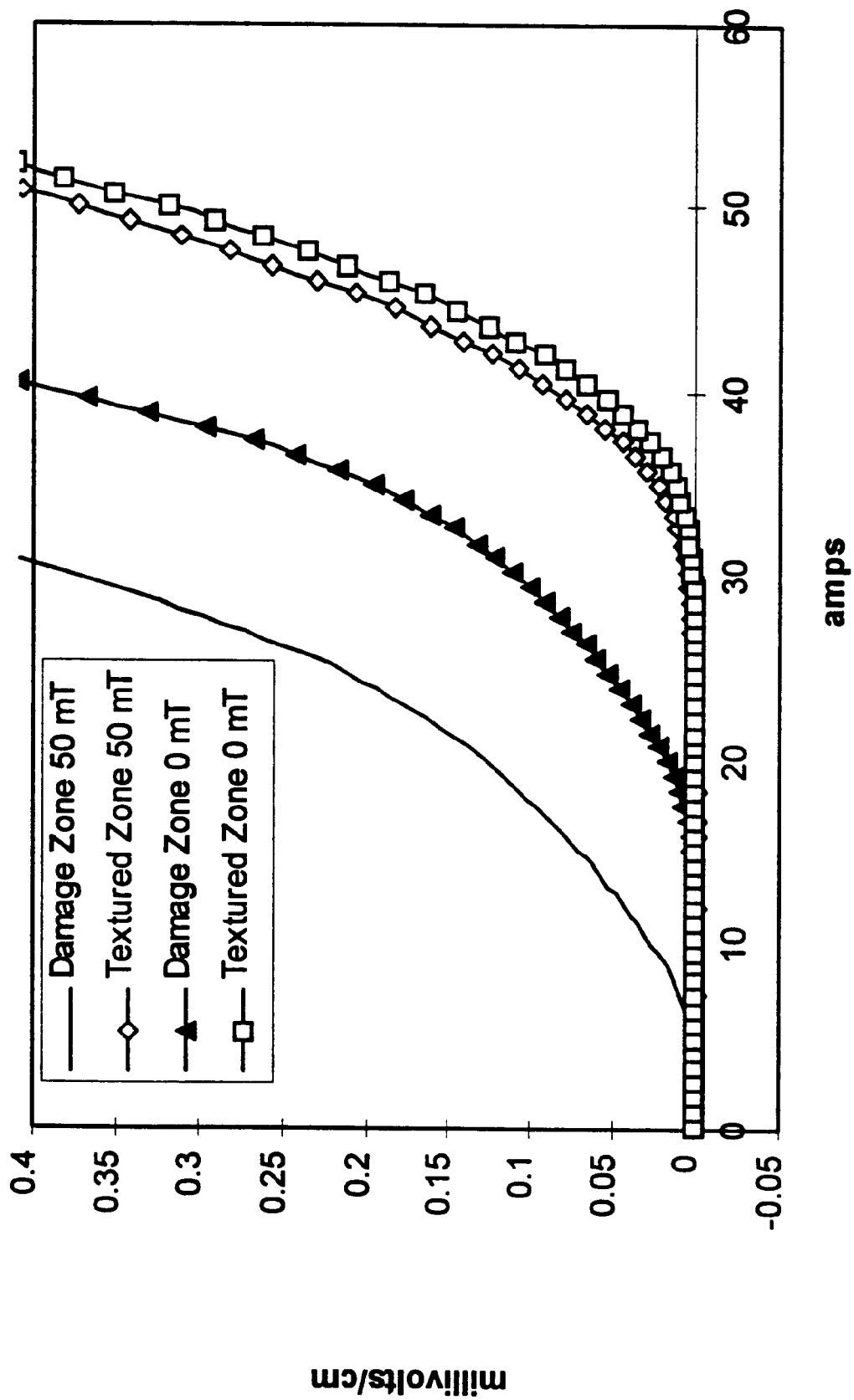
FIG. 11 is a graph showing the voltage to current characteristics at higher voltages for the same strand and magnetic field values used in FIG. 10.

The second sample was bent into a hairpin shape with a resistive component at the bend, and placed in a field of the same magnitude oriented along the preferred current path of the two legs of the sample. FIGS. 10 and 11 show voltage/current characteristics of the poorly superconducting regions (damage zone), and the high performance regions (texture zone). The resistive component shown in FIG. 10 is $50\times10^{-4}$ volts/m but occurs on only 1% to 5% of the total length, or a net of $5\times10^{-5}$ volts/m, resulting in a power loss of $P/V=E^*J=(5\times10^{-5} \text{ volts/m})(2\times10^7 \text{ amp/m2})=5\times10^2$ watt/m3, a factor of 10 less than the helically wound sample.

EXAMPLE 7

Figure 12:
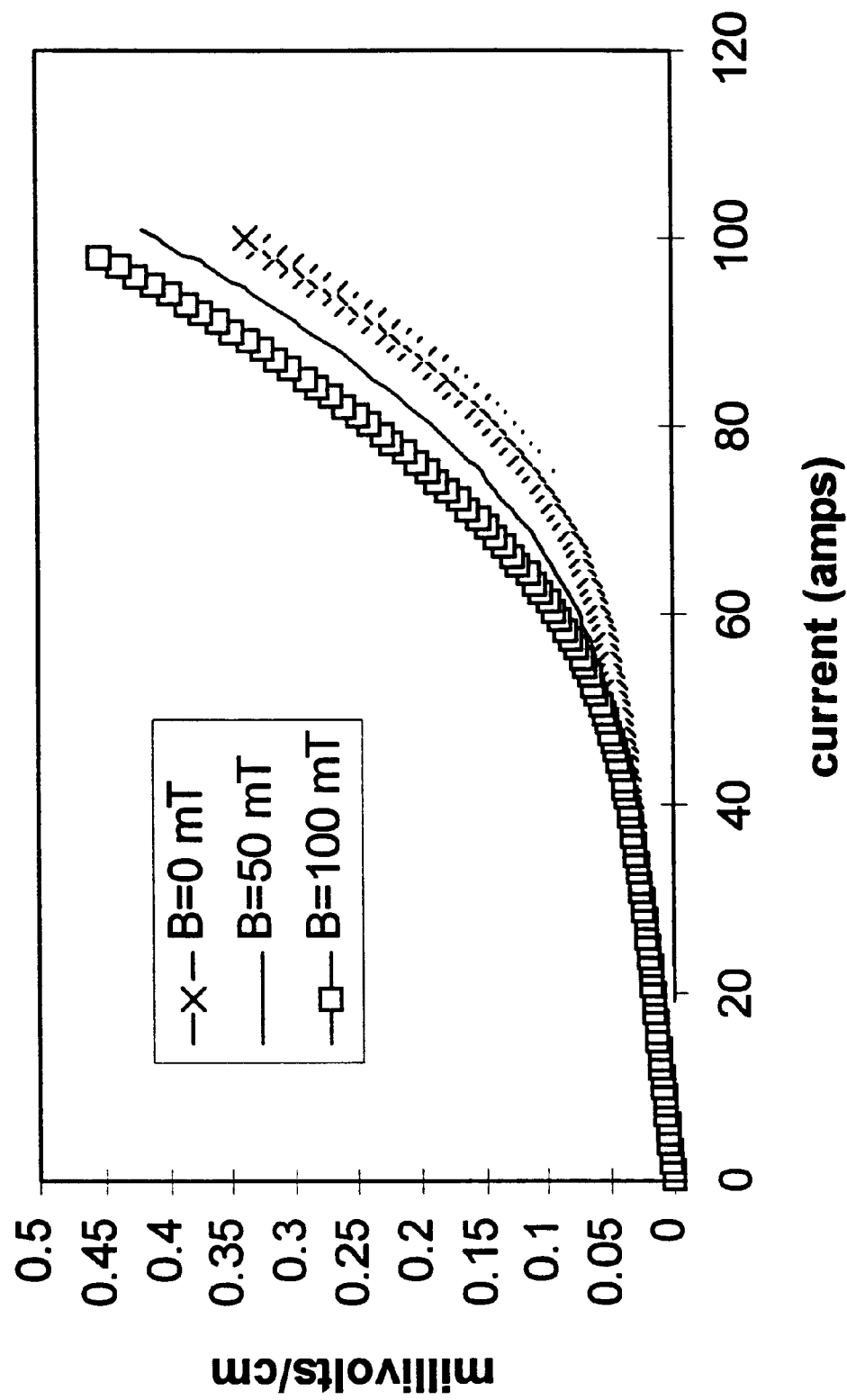
FIG. 12 is a graph showing the voltage to current characteristics in three different magnetic fields, for a cabled conductor made in accordance with an embodiment of the invention described in Example 2.

The voltage vs. current characteristics of a sample made as in Example 2 were measured in applied fields of 0 Tesla, 0.05 Tesla, and 0.1 Tesla orthogonal to the preferred direction of current flow in the cabled conductor. FIG. 12 shows the linear voltage/current characteristics at currents below 60 amps, a domain in which the high performance regions of the cabled conductor are clearly superconducting, and shows a transition to a regime where the high performance regions are partially superconducting beyond 60 amps. FIG. 12 shows evidence that the power dissipation due to cabling damage in the poorly superconducting regions is small at the rated current and field of the cable, and further suggests that, despite the presence of the poorly superconducting regions, the transition bwehavior of the cable resembles that of a completely superconducting cable.

The various features and advantages of the invention may be seen from the foregoing description. Iterative variations on the processes described above, such as changes in the oxide superconductor selected, the matrix materials, the strand formation methods and the thermomechanical processing steps will be seen to be within the scope of the invention. Many modifications and variations in the preferred embodiments illustrated will undoubtedly occur to those versed in the art, as will various other features and advantages not specifically enumerated, all of which may be achieved without departing from the spirit and scope of the invention as defined by the following claims.

What is claimed is:

1. An eccentric cabled conductor for use in a cryogenically cooled circuit including a refrigeration means having a predetermined operating temperature and efficiency, the conductor having a longitudinal axis and comprising
   a plurality of conductor strands each periodically bent around the longitudinal axis of the conductor at a preselected cabling period, the periodic bends producing a vertical cross-section for the conductor in which the major axis of the vertical cross-section is at least five times larger than the minor axis of the vertical cross-section,
   each conductor strand comprising a composite of one or more superconducting ceramic filaments and a conductive matrix material,
   the bends in each conductor strand causing periodic poorly superconducting regions in each filament therein, each poorly superconducting region in each filament having a length that is at least about half the width of that filament,
   the conductive matrix material being in intimate contact with the poorly superconducting regions to provide an alternate current path.

2. A cabled conductor according to claim 1 wherein one of the poorly superconducting regions is located in the general vicinity of each vertex of the cabled conductor.

3. A cabled conductor according to claim 1 wherein there are two high performance regions and two poorly superconducting regions per cabling period.

4. A cabled conductor according to claim 1 wherein the ratio of the average length of the poorly superconducting regions to the preselected cabling period is less than about $(\rho_{300}^e/\rho_o^e)\epsilon$, where $\rho_o^e$ is the resistivity of the composite at the operating temperature; $\rho_{300}^e$ is the resistivity of the composite at 300 Kelvins; and $\epsilon$ is the predetermined efficiency of the refrigeration means at the operating temperature of the refrigeration means.

5. A cabled conductor according to claim 4 wherein the average length of the poorly superconducting regions is less than about one fourth of the cabling period.

6. A cabled conductor according to claim 4 wherein the average length of the poorly superconducting regions is less than about one twentieth of the cabling period.

7. A cabled conductor according to claim 1 wherein the strands are insulated.

8. A cabled conductor according to claim 1 wherein the superconducting filaments comprise a superconducting oxide.

9. A cabled conductor according to claim 8 wherein the superconducting oxide is a member of the rare earth family of superconducting oxides.

10. A cabled conductor according to claim 9 wherein the superconducting oxide is a member of the yttrium-barium-copper-oxide family of superconducting oxides.

11. A cabled conductor according to claim 10 wherein the superconducting oxide is YBCO 123.

12. A cabled conductor according to claim 8 wherein the superconducting oxide is a member of the bismuth-strontium-calcium-copper-oxide family of superconductors.

13. A cabled conductor according to claim 12 wherein the superconducting oxide is BSCCO 2212.

14. A cabled conductor according to claim 12 wherein the superconducting oxide is BSCCO 2223.

15. A cabled conductor according to claim 12 wherein the cabled conductor is a Roebel cable.

16. A cabled conductor according to claim 1 wherein substantially the entire length of each of the one or more superconducting ceramic filaments is in intimate contact with the conductive matrix material.

17. A cabled conductor according to claim 1 wherein the strands are continuous.

18. A cabled conductor according to claim 1 wherein the strands are fully transposed.

19. A cabled conductor according to claim 18 wherein the cabled conductor is a Litz cable.

20. A cabled conductor according to claim 19 wherein the cabled conductor is a Rutherford cable.

21. A cabled conductor according to claim 19 wherein the cabled conductor is a braided cable.

22. A cabled conductor according to claim 1 wherein the strands are partly transposed.

23. A cabled conductor according to claim 1 wherein the conductive matrix material is silver.

24. A cabled conductor according to claim 1 wherein the conductive matrix material is a silver alloy.

25. A cabled conductor according to claim 1 having a packing factor of at least 75%.

26. A cabled conductor according to claim 1 having a packing factor of at least 85%.

27. A cabled conductor according to claim 1 wherein the cabling period is in the range of 1 to 50 times the width of the cabled conductor.

28. A method of using a cabled conductor having a rated temperature and a rated current in a cryogenically cooled circuit including a refrigeration means having a predetermined efficiency and a predetermined operating temperature no less than the rated temperature of the cabled conductor, the conductor having a longtudinal axis and including
 a plurality of conductor strands bent around the longitudinal axis of the conductor at a preselected cabling period, each strand including a composite of one or more superconducting ceramic filaments and a conductive matrix material,
 the bends in each conductor strand causing periodic poorly superconducting regions in each filament therein, each of the poorly superconducting regions in each filament having a length that is at lest about half the width of that filament,
 the conductive matrix material being in intimate contact with the poorly superconducting regions to provide an alternate current path,
 the method comprising the steps of:
  cooling the conductor to the operating temperature of the refrigeration means; and
  supply a current along the longitudinal axis of the conductor which is less than the rated current of the conductor but greater than the critical current of at least one of the poorly superconducting regions.

29. A method of using a cabled conductor having a rated temperature and a rated current in a cryogenically cooled circuit including a refrigeration means having a predetermined efficiency and a predetermined operating temperature no less than the rated temperature of the cabled conductor, the conductor having a longitudinal axis and including
 a plurality of conductor strands bent around the longitudinal axis of the conductor at a preselected cabling period, each strand including a composite of one or more superconducting ceramic filaments and a conductive matrix material,
 the bends in each conductor strand causing periodic poorly superconducting regions in each filament therein, each of the poorly superconducting regions in each filament having a length that is at least about half the width of that filament,
 the conductive matrix material being in intimate contact with the poorly superconducting regions to provide an alternate current path,
 the method comprising the steps of:
  cooling the conductor to the operating temperature of the refrigeration means; and
  applying a predetermined magnetic field to the conductor having a primary component orthogonal to the preferred direction of the conductor which is less than the rated magnetic field of the conductor but greater than the critical magnetic field of at least one of the poorly superconducting regions.

* * * * *

UNITED STATES PATENT AND TRADEMARK OFFICE
CERTIFICATE OF CORRECTION

PATENT NO. : 6,284,979 B1
DATED : September 4, 2001
INVENTOR(S) : Gregory L. Snitchler, Alexis P. Malozemoff, Jeffrey M. Seuntjens, William L. Barnes, Gilbert N. Riley, Jr. and Alexander Otto It is certified that error appears in the above-identified patent and that said Letters Patent is hereby corrected as shown below:

Title page,
Item [56], References Cited,
Under U.S. PATENT DOCUMENTS, change "Desch" to -- Dersch --
Under OTHER PUBLICATIONS, change "Ramam" to -- Raman --, change "Schewenterly" to -- Schwenterly -- and change -- "Measurement" to -- Measurements --
Item [57], ABSTRACT,
Line 19, change "$\rho_{300}{}^e/\rho_o{}^e)\varepsilon$ E," to -- $(\rho_{300}^e / \rho_0^e)$E, -- and "$\rho_o{}^e$" to -- $\rho_0^e$ --
Line 20, change "$\rho^e{}_{300}$" to -- $\rho_{300}^e$ --

Column 1,
Lines 8, 9, 12 & 13, delete "now abandoned" in both places
Line 45, delete "the"

Column 6,
Line 44, should be -- "least" -- not "lest"

Column 7,
Line 29, change "10" to -- 1 --

Column 8,
Line 51, change "20" to -- 10 --

Column 10,
Line 25, delete "at the"
Line 34, delete "if"

Column 11,
Line 62, change "an" to -- any --

Column 12,
Line 50, delete "in"

Column 15,
Line 19, change "(EJ$^n$)" to -- (E $\propto$ J$^n$) --
Line 40, insert -- . -- after "D/L"

Column 16,
Line 5, remove "the"
Line 7, change second occurrence of "$\rho_o{}^e$" to -- $\rho_0^e$ --
Line 16, change "operting" to -- operating --

UNITED STATES PATENT AND TRADEMARK OFFICE
CERTIFICATE OF CORRECTION

PATENT NO. : 6,284,979 B1
DATED : September 4, 2001
INVENTOR(S) : Gregory L. Snitchler, Alexis P. Malozemoff, Jeffrey M. Seuntjens, William L. Barnes, Gilbert N. Riley, Jr. and Alexander Otto It is certified that error appears in the above-identified patent and that said Letters Patent is hereby corrected as shown below:

Column 17,
Line 42, change "place" to -- placed --
Line 67, change "at" to -- a --

Column 20,
Line 11, change "bwehavior" to -- behavior --

Column 22,
Line 2, change "longtudinal" to -- longitudinal --
Line 12, change "lest" to -- least --

Signed and Sealed this

Sixteenth Day of July, 2002

Attest:

JAMES E. ROGAN
Attesting Officer
Director of the United States Patent and Trademark Office